United States Patent
Ryu et al.

(10) Patent No.: US 11,955,706 B2
(45) Date of Patent: Apr. 9, 2024

(54) ELECTRONIC DEVICE INCLUDING CONNECTOR

(71) Applicant: LG ELECTRONICS INC., Seoul (KR)

(72) Inventors: Seungwoo Ryu, Seoul (KR); Joohee Lee, Seoul (KR); Junyoung Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 354 days.

(21) Appl. No.: 17/594,495

(22) PCT Filed: Apr. 25, 2019

(86) PCT No.: PCT/KR2019/005009
§ 371 (c)(1),
(2) Date: Oct. 19, 2021

(87) PCT Pub. No.: WO2020/218642
PCT Pub. Date: Oct. 29, 2020

(65) Prior Publication Data
US 2022/0181775 A1    Jun. 9, 2022

(51) Int. Cl.
*H05K 1/14* (2006.01)
*H01Q 1/48* (2006.01)
(Continued)

(52) U.S. Cl.
CPC ............... *H01Q 1/48* (2013.01); *H01Q 21/06* (2013.01); *H05K 1/0225* (2013.01);
(Continued)

(58) Field of Classification Search
CPC .... H05K 1/0225; H05K 1/0251; H05K 1/181; H05K 1/0227; H05K 1/0228; H05K 1/14;
(Continued)

(56) References Cited

U.S. PATENT DOCUMENTS

2017/0179653 A1    6/2017    Cho

FOREIGN PATENT DOCUMENTS

| JP | 3973402 | 9/2007 |
|----|---------|--------|
| JP | 2013026102 | 2/2013 |

(Continued)

OTHER PUBLICATIONS

PCT International Application No. PCT/KR2019/005009, International Search Report dated Jan. 22, 2020, 9 pages.

*Primary Examiner* — Hoa C Nguyen
(74) *Attorney, Agent, or Firm* — LEE, HONG, DEGERMAN, KANG & WAIMEY

(57) ABSTRACT

An electronic device according to the present invention comprises: a first multi-layer printed circuit board (PCB) including a transceiver circuit; a second multi-layer PCB including an antenna; and a connector configured to connect the first multi-layer PCB and the second multi-layer PCB to each other, wherein the first and the second multi-layer PCB include signal transmission lines configuring a vertical connection for signal transfer between different layers, and include multiple adjacent ground patterns configuring a vertical ground connection between the different boards. In order to improve the matching characteristic between the vertically connected signal transmission lines, window regions from which a metal pattern is eliminated are formed at the same positions in different layers of the first and the second multi-layer PCB between the adjacent ground patterns. Therefore, the present invention can provide the connector and the electronic device providing an optimal matching characteristic in vertically connecting the antenna and the transceiver circuit in mmWave bands.

22 Claims, 28 Drawing Sheets

(51) Int. Cl.
  *H01Q 21/06* (2006.01)
  *H05K 1/02* (2006.01)
  *H05K 1/18* (2006.01)
(52) U.S. Cl.
  CPC ........... *H05K 1/0251* (2013.01); *H05K 1/181* (2013.01); *H05K 2201/10189* (2013.01)
(58) Field of Classification Search
  CPC ........ H05K 1/141; H05K 1/142; H05K 1/144; H05K 1/145
  See application file for complete search history.

(56) References Cited

FOREIGN PATENT DOCUMENTS

| | | |
|---|---|---|
| JP | 2016225107 | 12/2016 |
| KR | 20180011655 | 2/2018 |

FIG 4A
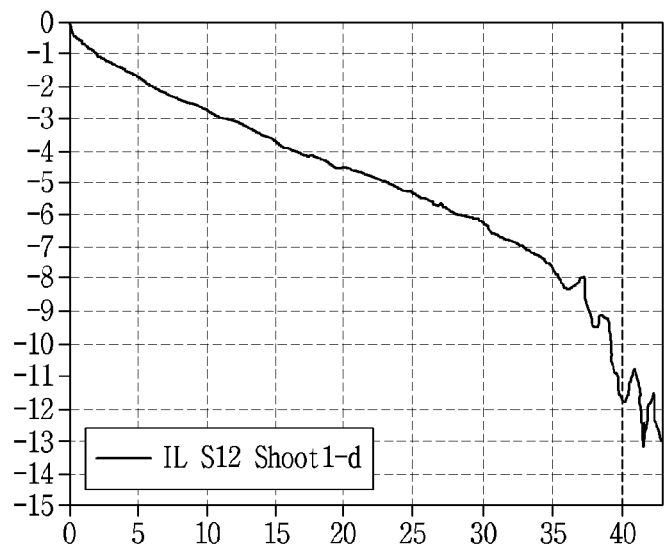
(a)
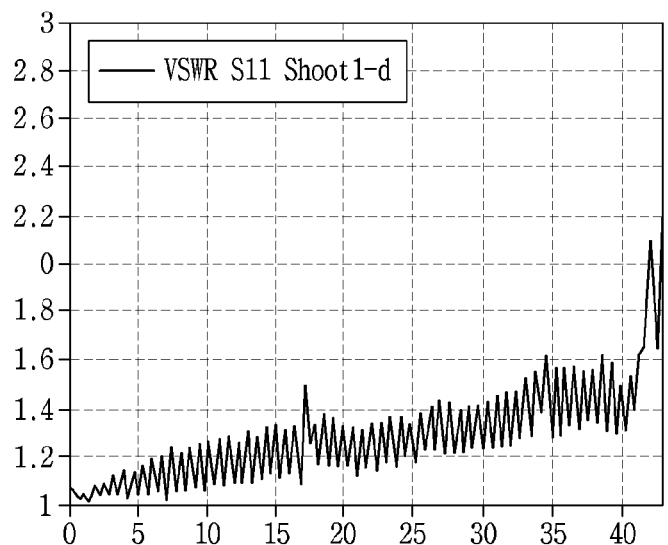
(b)

FIG. 6A
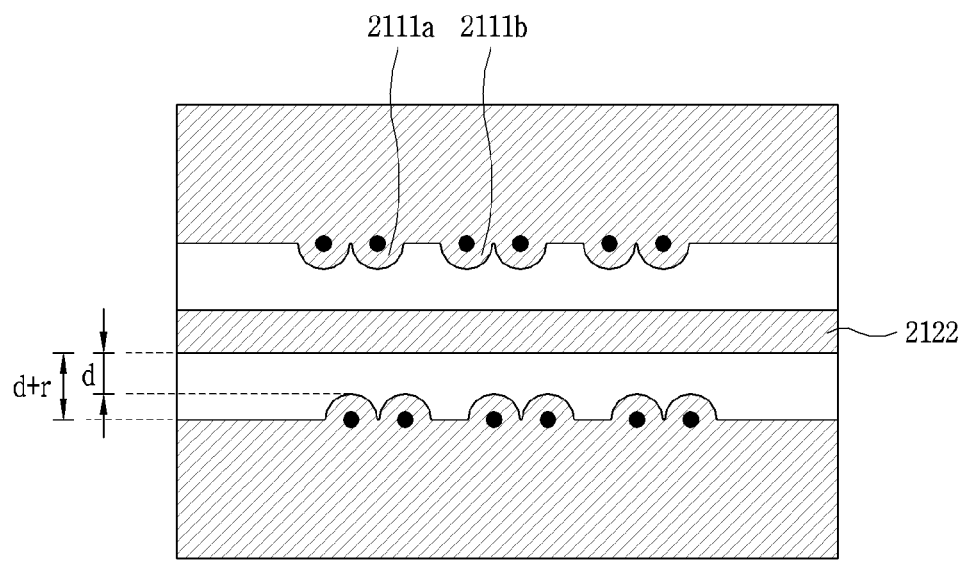
(a)
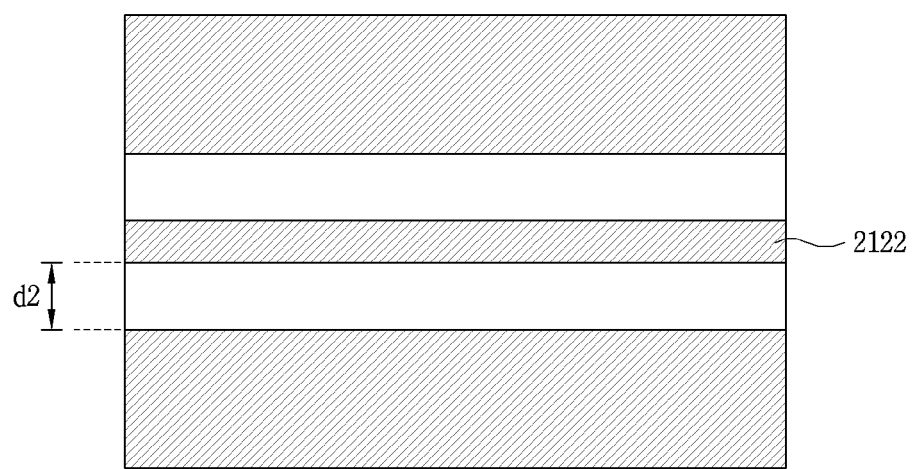
(b)

FIG 6B
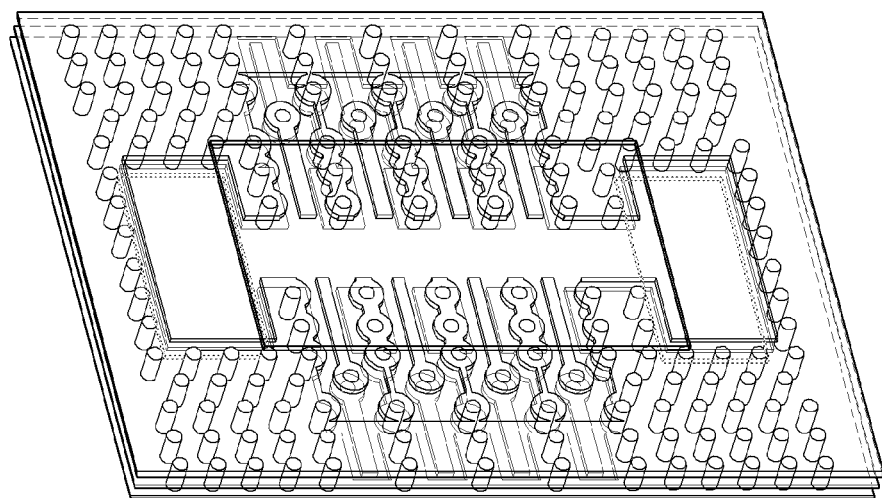
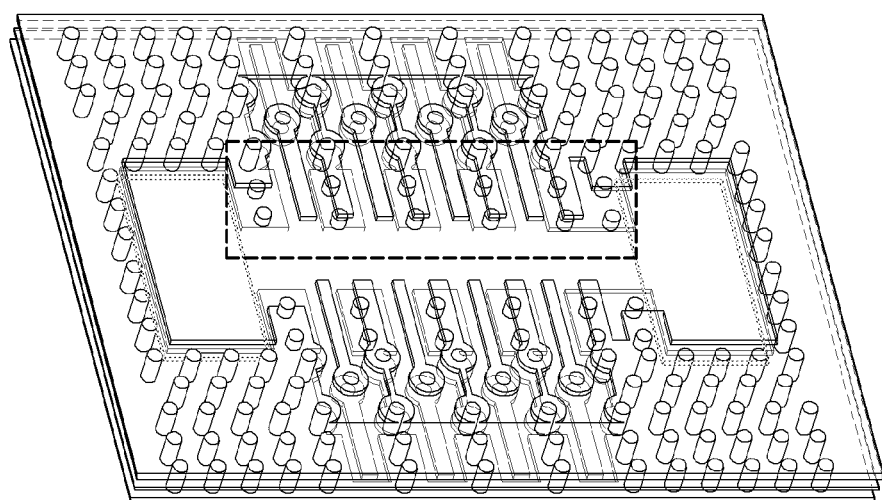

FIG. 7
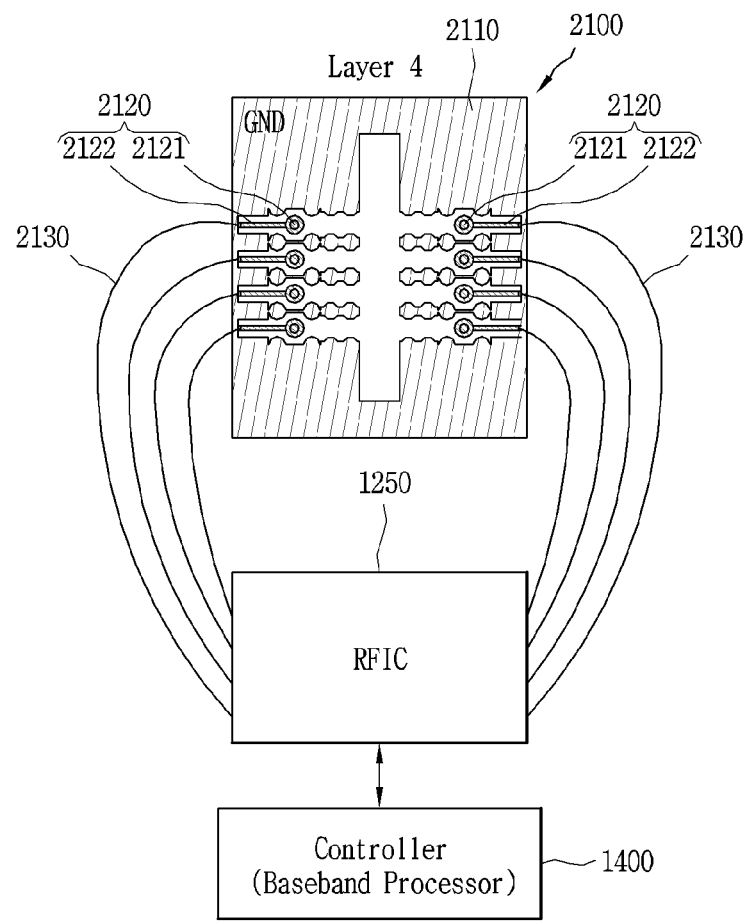
(a)
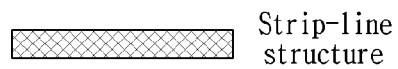
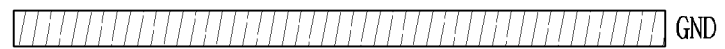
(b)

FIG 9
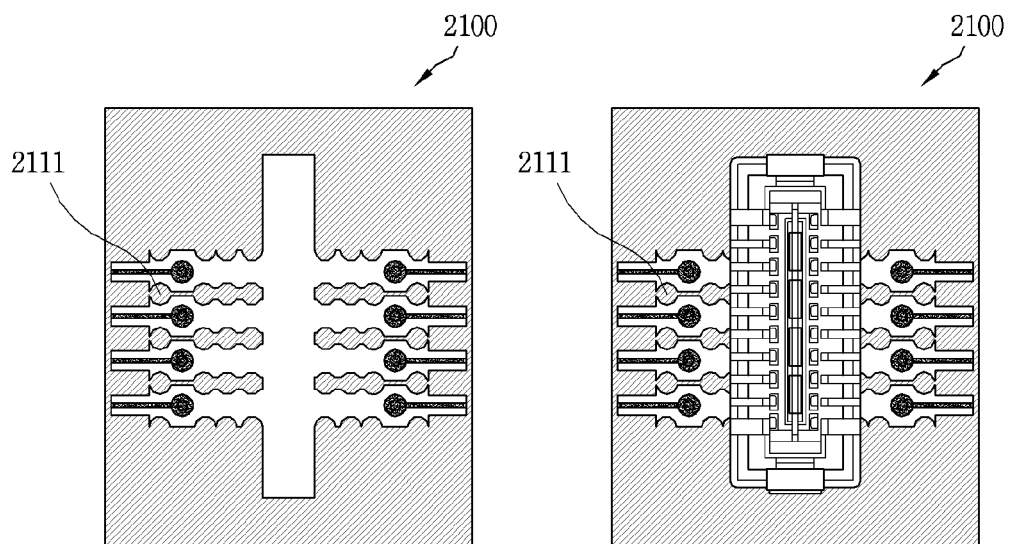
(a)
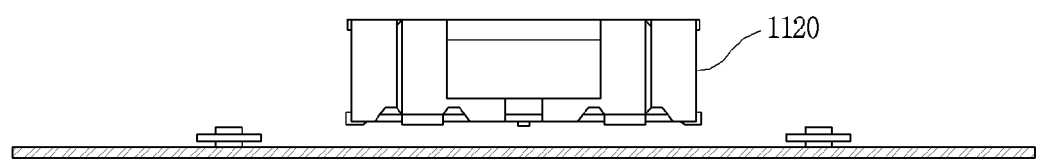
(b)
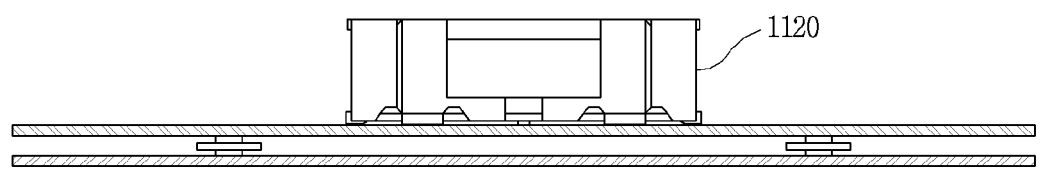
(c)

(a)

(b)

FIG 13B
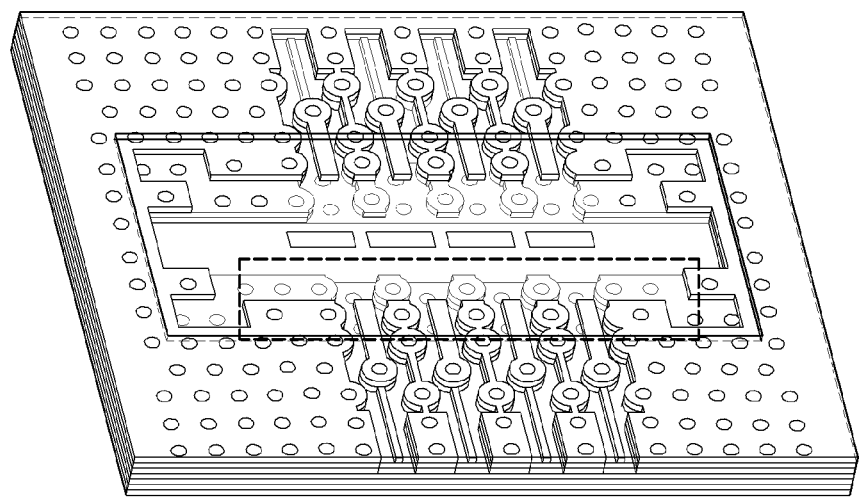
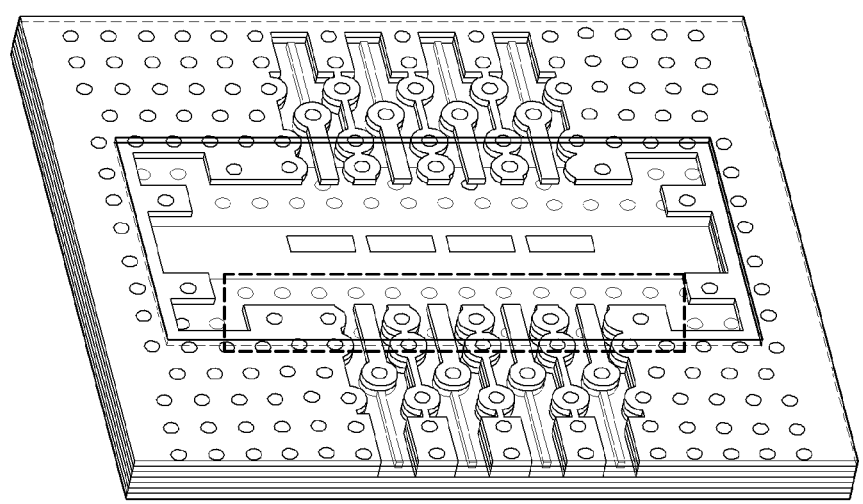

FIG 15
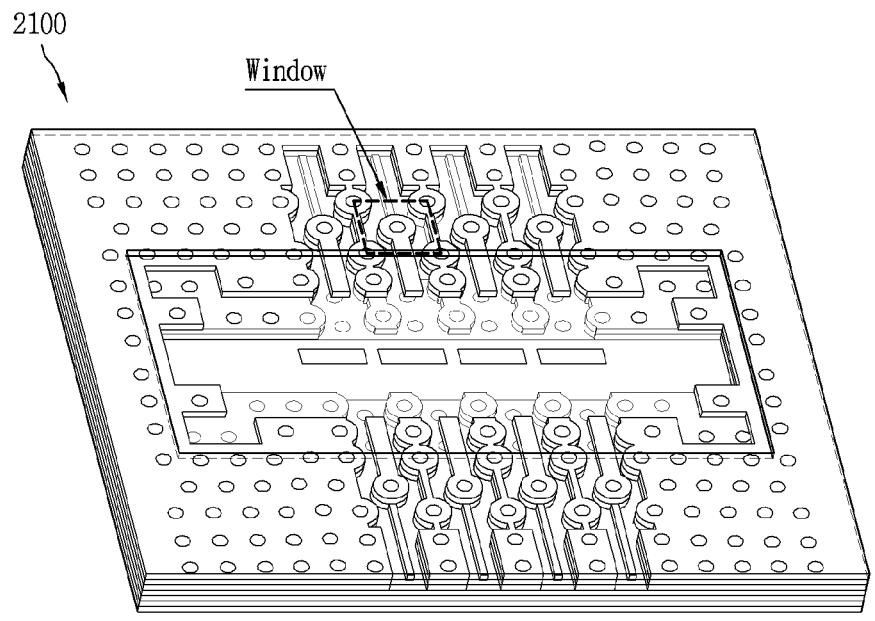
(a)
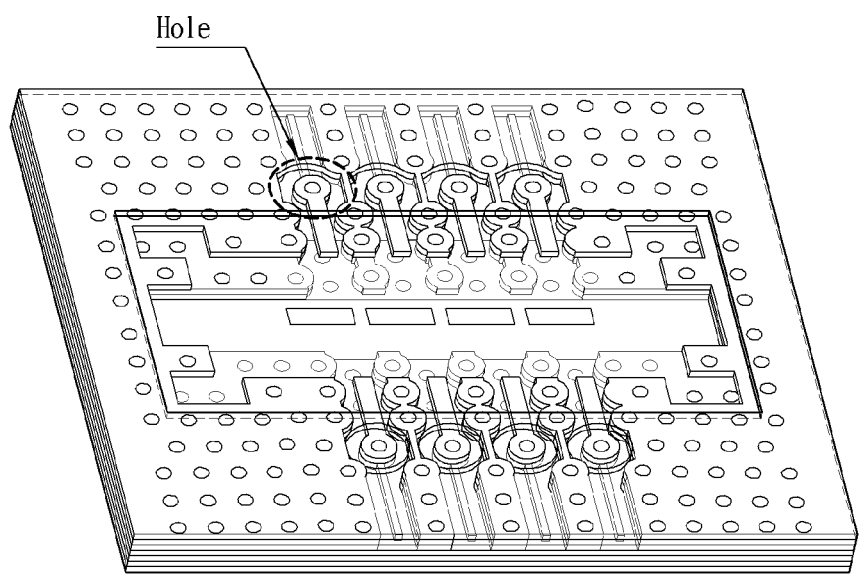
(b)

FIG. 16
(a)
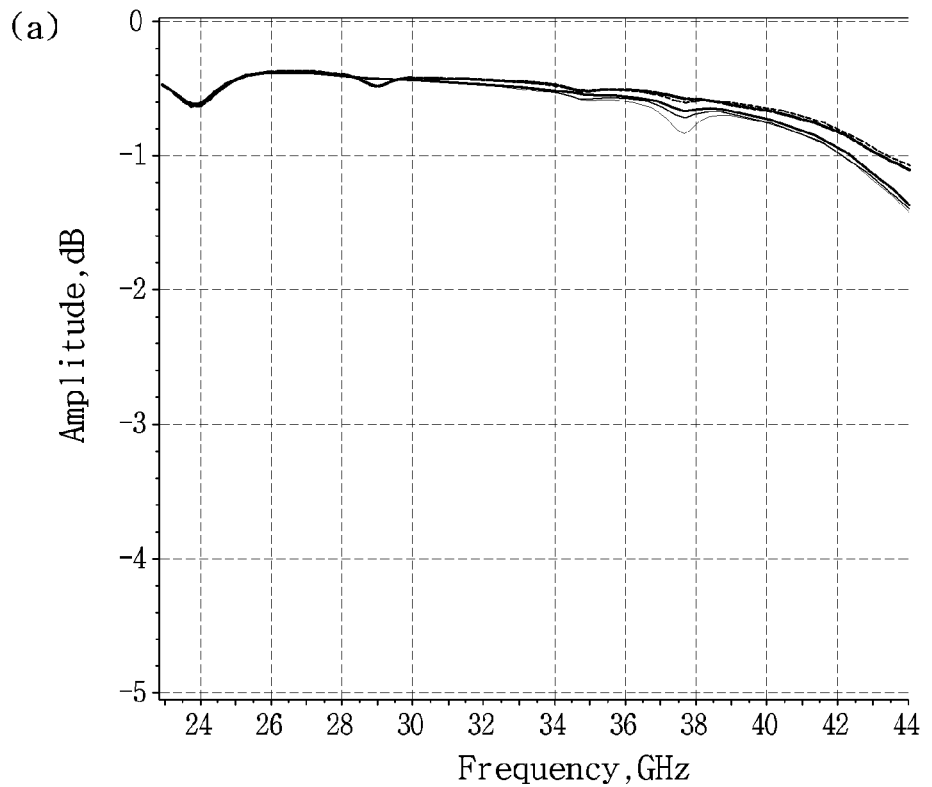
(b)
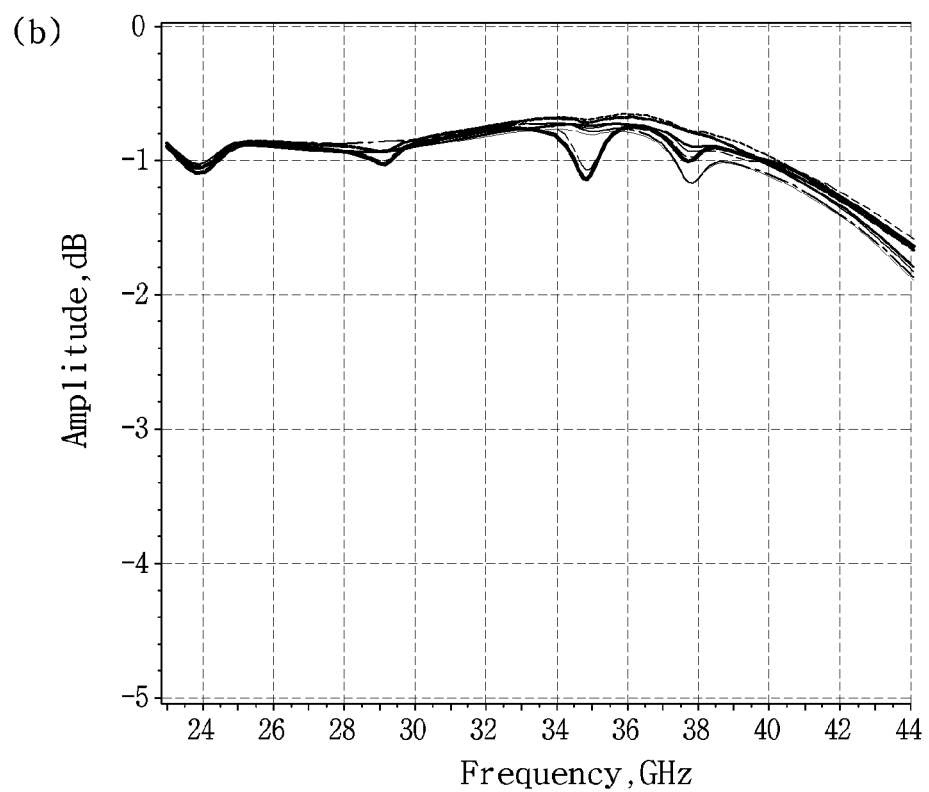

FIG 17
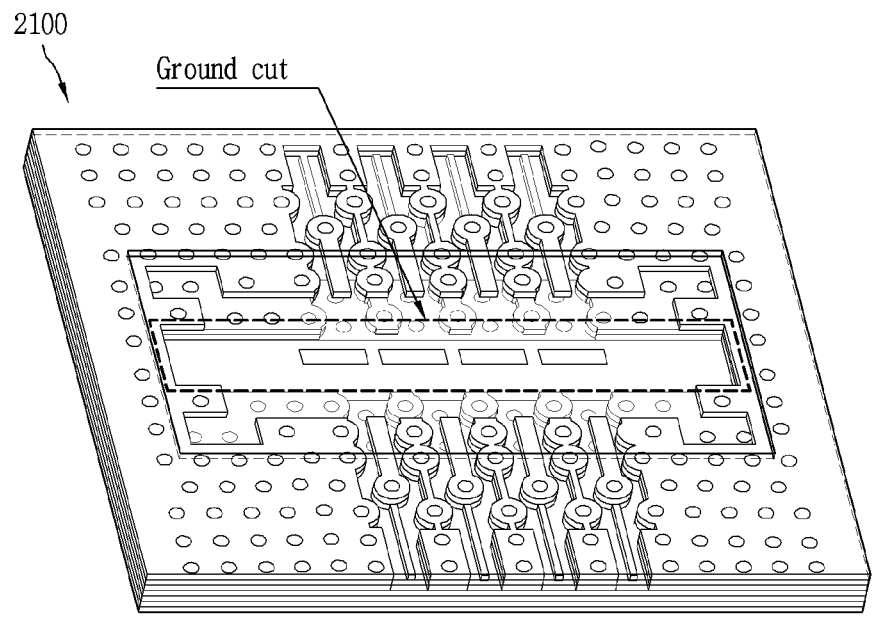
(a)
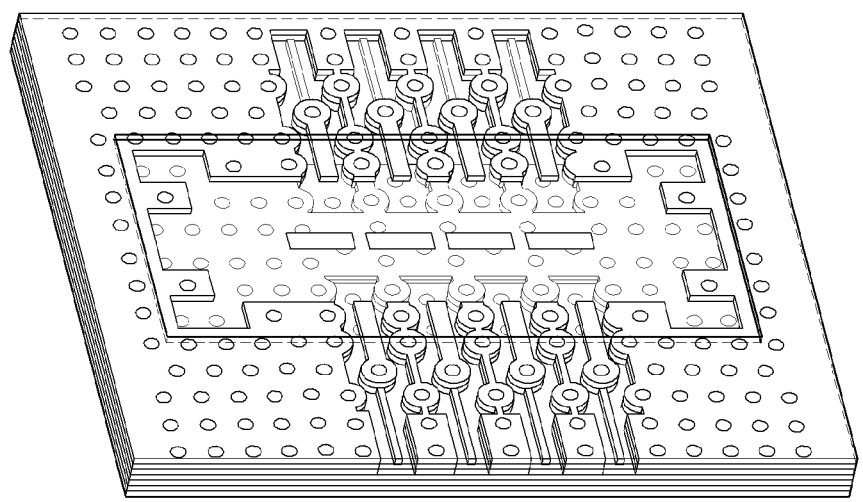
(b)

FIG 19
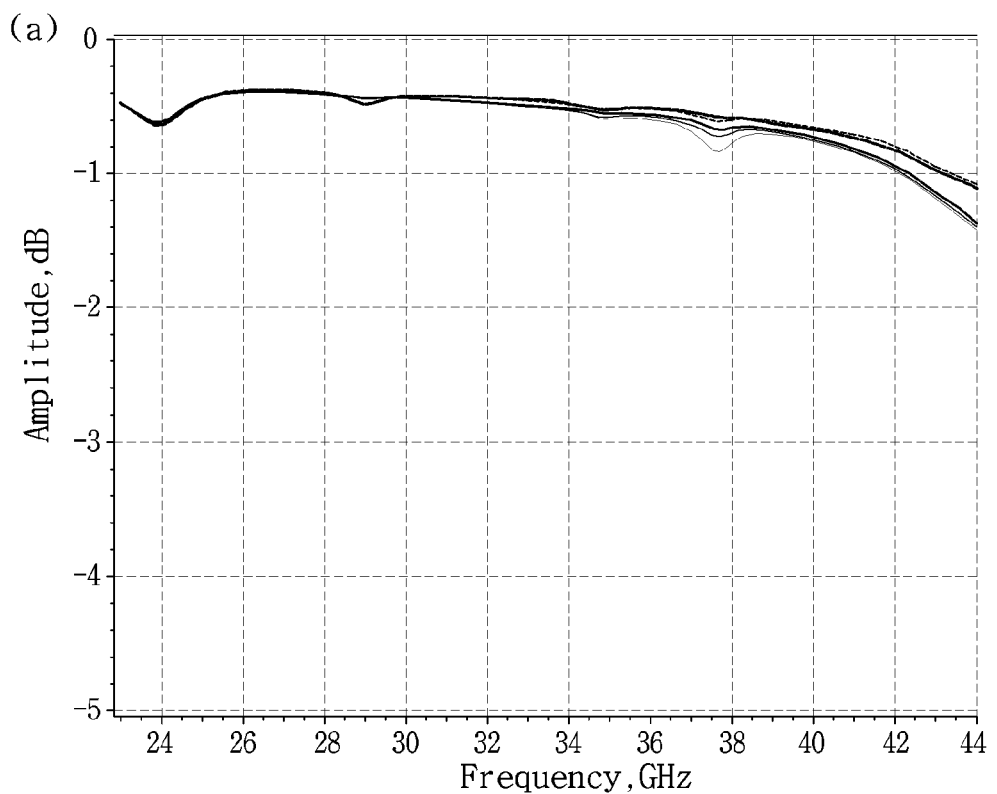
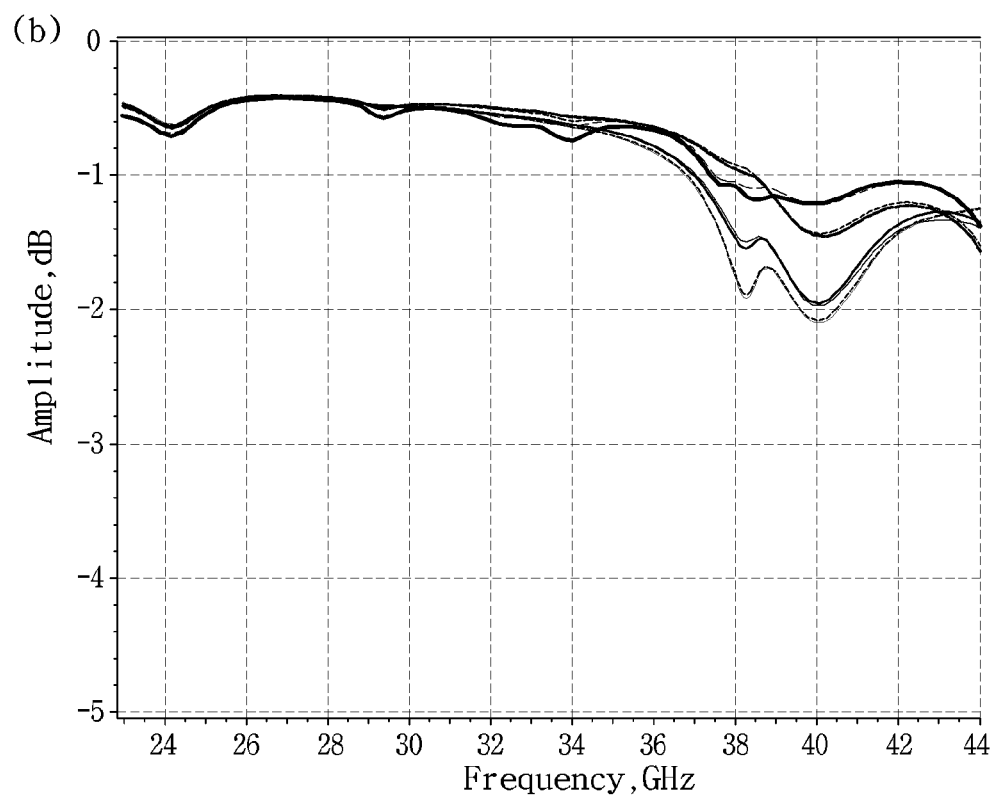

ELECTRONIC DEVICE INCLUDING CONNECTOR

CROSS-REFERENCE TO RELATED APPLICATIONS

This application is the National Stage filing under 35 U.S.C. 371 of International Application No. PCT/KR2019/005009, filed on Apr. 25, 2019, the contents of which is hereby incorporated by reference herein in its entirety.

FIELD

The present disclosure relates to an electronic device having a connector, and one detailed implementation relates to an electronic device having a connector for connecting an antenna and an RFIC.

BACKGROUND ART

Electronic devices may be divided into mobile/portable terminals and stationary terminals according to mobility. Also, the electronic devices may be classified into handheld types and vehicle mount types according to whether or not a user can directly carry.

Functions of electronic devices are diversifying. Examples of such functions include data and voice communications, capturing images and video via a camera, recording audio, playing music files via a speaker system, and displaying images and video on a display. Some electronic devices include additional functionality which supports electronic game playing, while other terminals are configured as multimedia players. Specifically, in recent time, mobile terminals can receive broadcast and multicast signals to allow viewing of video or television programs As it becomes multifunctional, an electronic device can be allowed to capture still images or moving images, play music or video files, play games, receive broadcast and the like, so as to be implemented as an integrated multimedia player.

Efforts are ongoing to support and increase the functionality of electronic devices. Such efforts include software and hardware improvements, as well as changes and improvements in the structural components.

In addition to those attempts, the electronic devices provide various services in recent years by virtue of commercialization of wireless communication systems using an LTE communication technology. In the future, it is expected that a wireless communication system using a 5G communication technology will be commercialized to provide various services. Meanwhile, some of LTE frequency bands may be allocated to provide 5G communication services.

In this regard, electronic devices may be configured to provide 5G communication services in various frequency bands. Recently, attempts have been made to provide 5G communication services using a Sub-6 band under a 6 GHz band. In the future, it is also expected to provide 5G communication services by using a millimeter-wave (mm-Wave) band in addition to the Sub-6 band for a faster data rate.

Meanwhile, an electronic device may include a connector for connecting antennas and a transceiver circuit, that is, an RFIC. In this regard, the related art connector has a problem in that insertion loss greatly increases when vertically (perpendicularly) connecting antennas and a transceiver circuit in a millimeter-wave band.

In particular, when a length of vertical vias increases as the antennas and the transceiver circuit are vertically connected in the millimeter-wave band, there is a problem in that insertion loss increases due to radiation by the vertical vias.

DISCLOSURE

Technical Problem

One aspect of the present disclosure is to solve the aforementioned problems and other drawbacks. Another aspect of the present disclosure is to provide a connector capable of reducing insertion loss when antennas and a transceiver circuit are connected vertically in a millimeter-wave band, and an electronic device having the same.

Still another aspect of the present disclosure is to provide a connector capable of reducing insertion loss due to radiation by vertical vias when a length of the vertical vias increases due to a vertical connection between antennas and a transceiver circuit in a millimeter-wave band, and an electronic device having the same.

Still another aspect of the present invention is to provide a connector device having optimized performance in consideration of both antennas and a transceiver circuit of a multilayered PCB connected to a connector in a millimeter-wave band, and an electronic device having the same.

Technical Solution

In order to achieve these and other advantages and in accordance with the purpose of this specification, as embodied and broadly described herein, there is provided an electronic device that may include a first multilayered printed circuit board (PCB) including a transceiver circuit, a second multilayered PCB including antennas and a connector to connect the first multilayered PCB and the second multilayered PCB through a plurality of terminals. The first and second multilayered PCBs each may include signal transmission lines vertically connected for signal transmission between different layers thereof. The first and second multilayered PCBs each may include a plurality of ground patterns adjacent to one another to constitute a ground vertical-connection between different substrates.

In this instance, window regions from which metal patterns are removed may be formed between the adjacent ground patterns at the same position of different layers of the first and second multilayered PCBs, so as to improve a matching characteristic at the vertically connected signal transmission lines. Thus, a connector and an electronic device that provide optical matching characteristics in vertically connecting the antennas and the transceiver circuit in a millimeter-wave band can be provided.

In one implementation, the signal transmission lines may vertically connect different substrates of the first or second multilayered PCB by signal vias. The windows may be formed in a middle substrate disposed between the vertically connected substrates at positions corresponding to the signal vias to be larger than via pads including the signal vias, and electrical characteristics by the vertically connected signal vias can be improved by the windows.

In one implementation, ground planes may be removed from regions of different substrates of the first and second multilayered PCBs corresponding to regions in which the connector is disposed, so as to eliminate a ground resonance phenomenon caused by the connector and the grounds.

In one implementation, a top layer of the first multilayered PCB may include connection terminals for electrical connection with the connector and a dummy pattern for attachment of the connector. An entire bottom layer of the first multilayered PCB may be configured as a ground plane, and the ground planes may be removed in the same shape from a plurality of middle layers between the top layer and the bottom layer in regions corresponding to regions where the connector is disposed.

In one implementation, a top layer of the second multilayered PCB may include connection terminals for electrical connection with the connector, and a bottom layer of the second multilayered PCB may be configured such that a ground is partially removed from both sides thereof. In this instance, the ground plane may be removed from a middle layer between the top layer and the bottom layer in a region corresponding to a region where the connector is disposed, and a dummy pattern for the attachment of the connector may not be provided on a top of the second multilayered PCB.

In one implementation, each of the first and second multilayered PCBs may include ground patterns constituting a ground vertical-connection between different layers.

In one implementation, the ground patterns each may include ground pads on which ground vias for the ground vertical-connection are disposed, and a ground line connecting the ground pads. In one implementation, the ground patterns may be formed on the same position of different layers of the first and second multilayered PCBs.

In one implementation, the ground pattern may be provided in plurality to correspond to a plurality of ground terminals of the connector, and a signal transmission line may be disposed between the plurality of ground patterns. A length of a signal line of the signal transmission line may be the same as a length of the ground pad of the ground pattern.

In one implementation, the ground pad may include first and second circular ground pads each having the same circular shape as that of the ground via, and each of the first and second circular ground pads may be connected to the ground line having a width narrower than a diameter of the ground pad.

In one implementation, the signal transmission line may include signal pads on which signal vias for the vertical connection for the signal transmission are disposed, and a signal line connected to the signal pads, having a width narrower than a diameter of the signal pads, and extending by a predetermined length.

In one implementation, the electronic device may further include a transceiver circuit to receive signals from the antennas through different signal terminals of the connector or transmit signals to the antennas through the different signal terminals of the connector.

In one implementation, the electronic device may further include a baseband processor to control a first reception signal and a second reception signal received from the antennas to the transceiver circuit through different signal terminals of the connector.

In one implementation, each of a first connecting portion connected to the first multilayered PCB and a second connecting portion connected to the second multilayered PCB may include eight terminals. The baseband processor may control the transceiver circuit to perform MIMO through a first array antenna including four antennas connected four of the eight terminals of the second connecting portion and a second array antenna including four antennas connected to remaining four terminals of the second connecting portion.

A connector device according to another aspect of the present disclosure may be provided. The connector device may include a first connecting portion having a plurality of terminals to be connected to a first multilayered printed circuit board (PCB), and a second connecting portion having a plurality of terminals to be connected to a second multilayered PCB. Signal transmission lines of the first multilayered PCB and the second multilayered PCB may be connected to each other by the first connecting portion and the second connecting portion, to transmit Radio Frequency (RF) signals. In this instance, ground planes may be removed from regions of different substrates of the first and second multilayered PCBs corresponding to regions where the connector is disposed, so as to eliminate a ground resonance phenomenon caused by the connector and the grounds.

In one implementation, a top layer of the first multilayered PCB may include connection terminals for electrical connection with the connector and a dummy pattern for attachment of the connector. An entire bottom layer of the first multilayered PCB may be configured as a ground plane, and the ground planes may be removed in the same shape from a plurality of middle layers between the top layer and the bottom layer in regions corresponding to regions where the connector is disposed.

In one implementation, a top layer of the second multilayered PCB may include connection terminals for electrical connection with the connector, and a bottom layer of the second multilayered PCB may be configured such that a ground is partially removed from both sides thereof. In this instance, the ground plane may be removed from a middle layer between the top layer and the bottom layer in a region corresponding to a region where the connector is disposed, and a dummy pattern for the attachment of the connector may not be provided on a top of the second multilayered PCB.

In one implementation, the signal transmission lines may vertically connect different substrates of the first or second multilayered PCB by signal vias. The windows may be formed in a middle substrate disposed between the vertically connected substrates at positions corresponding to the signal vias to be larger than via pads including the signal vias, and electrical characteristics by the vertically connected signal vias can be improved by the windows.

In one implementation, a transceiver circuit may be disposed on the first multilayered PCB, and antennas may be disposed on the second multilayered PCB. In this case, each of the first and second multilayered PCBs may include ground patterns constituting a ground vertical-connection between different layers.

In one implementation, the ground patterns each may include ground pads on which ground vias for the ground vertical-connection are disposed, and a ground line connecting the ground pads. Here, the ground patterns may be formed on the same position of different layers of the first and second multilayered PCBs.

In one implementation, the ground pattern may be provided in plurality to correspond to a plurality of ground terminals of the connector. A signal transmission line may be disposed between the plurality of ground patterns. A length of a signal line of the signal transmission line may be the same as a length of the ground pad of the ground pattern.

In one embodiment, the ground pad may include first and second circular ground pads having the same circular shape as that of the ground via. In this case, each of the first and second circular ground pads may be connected to the ground line having a width narrower than a diameter of the ground pad.

In one implementation, the first and second multilayered PCBs each may include a signal transmission line constituting a vertical connection for a signal transmission between different layers.

In one implementation, the signal transmission line may include signal pads on which signal vias for the vertical connection for the signal transmission are disposed, and a signal line connected to the signal pads, having a width narrower than a diameter of the signal pads, and extending by a predetermined length.

Advantageous Effects

According to at least one implementation of the present disclosure, when vertically connecting antennas and a transceiver circuit in a millimeter-wave band, a connector that is capable of reducing insertion loss by optimizing circuit patterns around vertical vias can be provided.

In addition, according to at least one implementation of the present disclosure, a connector that is capable of reducing insertion loss due to radiation by vertical vias when a length of the vertical vias increases due to a vertical connection between antennas and a transceiver circuit in a millimeter-wave band, and an electronic device having the same can be provided.

According to at least one implementation of the present disclosure, structure and shape of ground patterns inside a multilayered PCB connected to a connector device can be optimized for each layer, so as to improve performance of the connector device according to optimal matching between transmission lines and grounds.

According to at least one implementation of the present disclosure, structure and shape of ground patterns inside a multilayered PCB connected to a connector device can be optimized for each layer, so as to prevent deterioration of performance of the connector device due to resonance between antennas connected to the connector and grounds.

BRIEF DESCRIPTION OF THE DRAWINGS

FIG. 4A is a view illustrating insertion loss (IL) and voltage standing wave ratio (VSWR) when the related art connector is used in the same frequency band as a millimeter-wave band.

FIG. 6A is a view showing comparison results between a coplanar waveguide (CPW) structure based on a circular ground pad according to the present disclosure and the related art CPW structure.

FIG. 6B is a view illustrating a PCB structure according to presence or absence of vias and ground patterns when ground pins are connected according to the present disclosure.

FIG. 7 is a conceptual view illustrating a connection between an RFIC PCB and each terminal of an RFIC according to the present disclosure and a conceptual view of a circuit structure according to the connection.

FIG. 9 is a view illustrating a connected state between Layer 4 of an RFIC PCB and connector terminals and a configuration in which the connector is connected to Layers 4 and 6 of the RFIC PCB, according to the present disclosure.

FIG. 13B is a view illustrating comparison results between a case of an optimized arrangement of a ground region and vias inside a multilayered PCB according to the present disclosure ((a) of FIG. 13B) and a case of a non-optimized arrangement ((b) of FIG. 13B).

FIG. 15 is a view illustrating a multilayered PCB structure for improving electrical characteristics by signal vias in a multilayered PCB connected to a connector according to the present disclosure, and a hole-type PCB structure for contrast.

FIG. 16 is a view illustrating comparison results of insertion loss between a case with windows according to the present disclosure and a case with holes.

FIG. 17 is a view illustrating a shape of a ground in a multilayered PCB on which a connector according to the present disclosure is disposed.

FIG. 19 is a view illustrating comparison results of insertion loss according to presence or absence of a ground cut according to the present disclosure.

MODES FOR CARRYING OUT PREFERRED IMPLEMENTATIONS

Figure 1A:
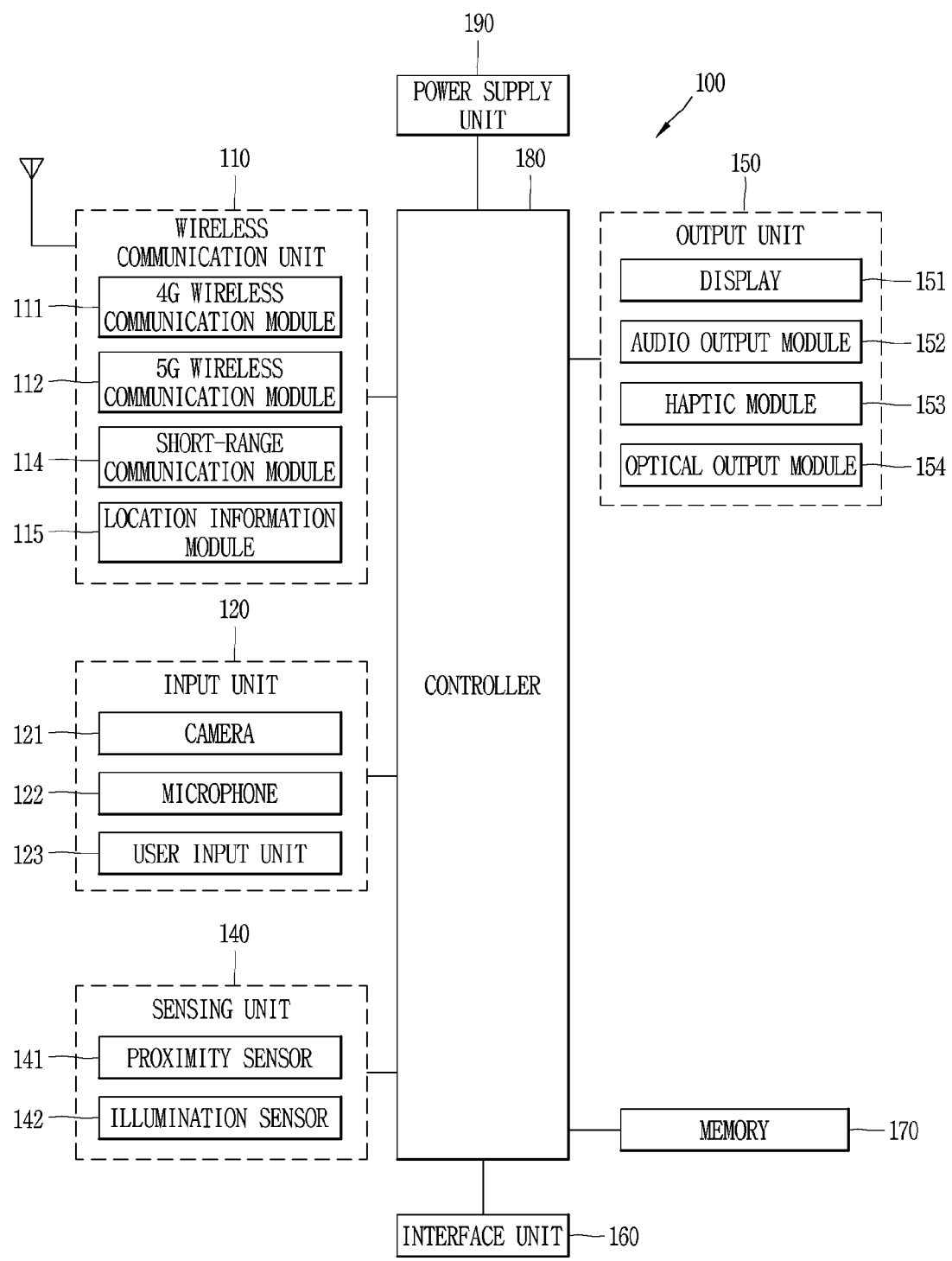
FIG. 1A is a block diagram of an electronic device in accordance with one implementation of the present disclosure.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Electronic devices presented herein may be implemented using a variety of different types of terminals. Examples of such devices include cellular phones, smart phones, laptop computers, digital broadcasting terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
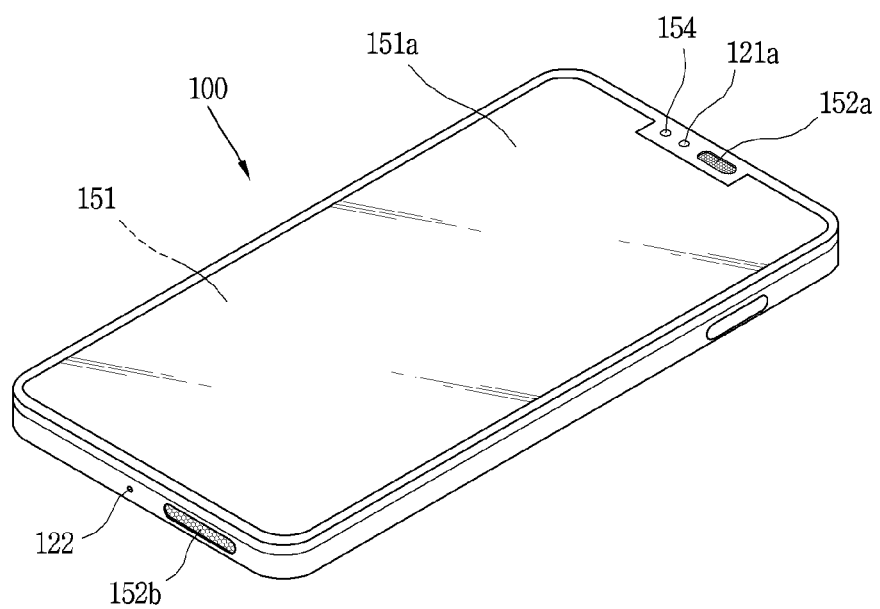
FIGS. 1B and 1C are conceptual views illustrating one example of the electronic device, viewed from different directions.
Figure 1C:
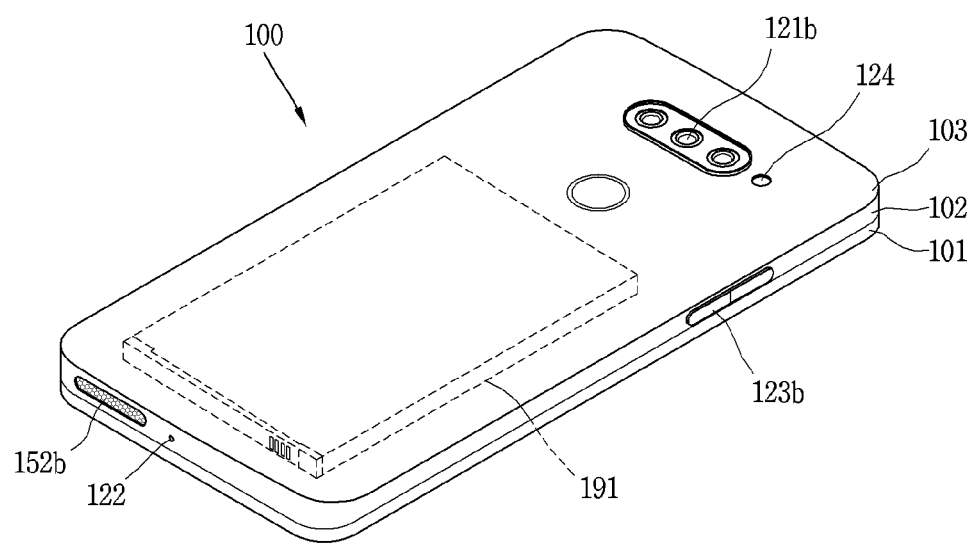

Referring to FIGS. 1A to 1C, FIG. 1A is a block diagram of an electronic device in accordance with one implementation of the present disclosure, and FIGS. 1B and 1C are conceptual views illustrating one example of an electronic device according to the present disclosure, viewed from different directions.

The electronic device 100 may be shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

In more detail, among others, the wireless communication unit 110 may typically include one or more modules which permit communications such as wireless communications between the electronic device 100 and a wireless communication system, communications between the electronic device 100 and another electronic device, or communications between the electronic device 100 and an external server. Further, the wireless communication unit 110 may typically include one or more modules which connect the electronic device 100 to one or more networks. Here, the one or more networks may be, for example, a 4G communication network and a 5G communication network.

The wireless communication unit 110 may include at least one of a 4G wireless communication module 111, a 5G wireless communication module 112, a short-range communication module 113, and a location information module 114.

The 4G wireless communication module 111 may perform transmission and reception of 4G signals with a 4G base station through a 4G mobile communication network. In this case, the 4G wireless communication module 111 may transmit at least one 4G transmission signal to the 4G base station. In addition, the 4G wireless communication module 111 may receive at least one 4G reception signal from the 4G base station.

In this regard, Uplink (UL) Multi-input and Multi-output (MIMO) may be performed by a plurality of 4G transmission signals transmitted to the 4G base station. In addition, Downlink (DL) MIMO may be performed by a plurality of 4G reception signals received from the 4G base station.

The 5G wireless communication module 112 may perform transmission and reception of 5G signals with a 5G base station through a 5G mobile communication network. Here, the 4G base station and the 5G base station may have a Non-Stand-Alone (NSA) structure. For example, the 4G base station and the 5G base station may be a co-located structure in which the stations are disposed at the same location in a cell. Alternatively, the 5G base station may be disposed in a Stand-Alone (SA) structure at a separate location from the 4G base station.

The 5G wireless communication module 112 may perform transmission and reception of 5G signals with a 5G base station through a 5G mobile communication network. In this case, the 5G wireless communication module 112 may transmit at least one 5G transmission signal to the 5G base station. In addition, the 5G wireless communication module 112 may receive at least one 5G reception signal from the 5G base station.

In this instance, 5G and 4G networks may use the same frequency band, and this may be referred to as LTE re-farming. Meanwhile, a sub-6 frequency band, which is a range of 6 GHz or less, may be used as the 5G frequency band.

On the other hand, a millimeter-wave (mmWave) range may be used as the 5G frequency band to perform broadband high-speed communication. When the mmWave band is used, the electronic device 100 may perform beamforming for communication coverage expansion with a base station.

On the other hand, regardless of the 5G frequency band, 5G communication systems can support a larger number of MIMO to improve a transmission rate. In this instance, UL MIMO may be performed by a plurality of 5G transmission signals transmitted to a 5G base station. In addition, DL MIMO may be performed by a plurality of 5G reception signals received from the 5G base station.

On the other hand, the wireless communication unit 110 may be in a Dual Connectivity (DC) state with the 4G base station and the 5G base station through the 4G wireless communication module 111 and the 5G wireless communication module 112. As such, the dual connectivity with the 4G base station and the 5G base station may be referred to as EUTRAN NR DC (EN-DC). Here, EUTRAN is an abbreviated form of "Evolved Universal Telecommunication Radio Access Network", and refers to a 4G wireless communication system. Also, NR is an abbreviated form of "New Radio" and refers to a 5G wireless communication system.

On the other hand, if the 4G base station and 5G base station are disposed in a co-located structure, throughput improvement is achieved by inter-Carrier Aggregation (inter-CA). Accordingly, when the 4G base station and the 5G base station are disposed in the EN-DC state, the 4G reception signal and the 5G reception signal may be simultaneously received through the 4G wireless communication module 111 and the 5G wireless communication module 112.

The short-range communication module 113 is configured to facilitate short-range communications. Suitable technologies for implementing such short-range communications include Bluetooth, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the electronic device 100 and a wireless communication system, communications between the electronic device 100 and another electronic device, or communications between the electronic device and a network where another electronic device (or an external server) is located, via wireless area network. One example of the wireless area networks is a wireless personal area network.

Short-range communication between electronic devices may be performed using the 4G wireless communication module 111 and the 5G wireless communication module 112. In one implementation, short-range communication may be performed between electronic devices in a device-to-device (D2D) manner without passing through base stations.

Meanwhile, for transmission rate improvement and communication system convergence, Carrier Aggregation (CA) may be carried out using at least one of the 4G wireless communication module 111 and the 5G wireless communication module 112 and the WiFi communication module 113. In this regard, 4G+WiFi CA may be performed using the 4G wireless communication module 111 and the Wi-Fi communication module 113. Or, 5G+WiFi CA may be performed using the 5G wireless communication module 112 and the Wi-Fi communication module 113.

The location information module 114 may be generally configured to detect, calculate, derive or otherwise identify a position (or current position) of the electronic device. As an example, the location information module 115 includes a Global Position System (GPS) module, a Wi-Fi module, or both. For example, when the electronic device uses a GPS module, a position of the electronic device may be acquired using a signal sent from a GPS satellite. As another example, when the electronic device uses the Wi-Fi module, a position of the electronic device can be acquired based on information related to a wireless Access Point (AP) which transmits or receives a wireless signal to or from the Wi-Fi module. If desired, the location information module 115 may alternatively or additionally function with any of the other modules of the wireless communication unit 110 to obtain data related to the position of the electronic device. The location information module 115 is a module used for acquiring the position (or the current position) of the electronic device and may not be limited to a module for directly calculating or acquiring the position of the electronic device.

Specifically, when the electronic device utilizes the 5G wireless communication module 112, the position of the electronic device may be acquired based on information related to the 5G base station which performs radio signal transmission or reception with the 5G wireless communication module. In particular, since the 5G base station of the mmWave band is deployed in a small cell having a narrow coverage, it is advantageous to acquire the position of the electronic device.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensor unit 140 may typically be implemented using one or more sensors configured to sense internal information of the electronic device, the surrounding environment of the electronic device, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The electronic device disclosed herein may be configured to utilize information obtained from one or more sensors, and combinations thereof.

The output unit 150 may typically be configured to output various types of information, such as audio, video, tactile output, and the like. The output unit 150 may be shown having at least one of a display 151, an audio output module 152, a haptic module 153, and an optical output module 154. The display 151 may have an inter-layered structure or an integrated structure with a touch sensor in order to implement a touch screen. The touch screen may function as the user input unit 123 which provides an input interface between the electronic device 100 and the user and simultaneously provide an output interface between the electronic device 100 and a user.

The interface unit 160 serves as an interface with various types of external devices that are coupled to the electronic device 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the electronic device 100 may perform assorted control functions associated with a connected external device, in response to the external device being connected to the interface unit 160.

The memory 170 is typically implemented to store data to support various functions or features of the electronic device 100. For instance, the memory 170 may be configured to store application programs executed in the electronic device 100, data or instructions for operations of the electronic device 100, and the like. Some of these application programs may be downloaded from an external server via wireless communication. Other application programs may be installed within the electronic device 100 at the time of manufacturing or shipping, which is typically the case for basic functions of the electronic device 100 (for example, receiving a call, placing a call, receiving a message, sending a message, and the like). It is common for application programs to be stored in the memory 170, installed in the electronic device 100, and executed by the controller 180 to perform an operation (or function) for the electronic device 100.

The controller 180 typically functions to control an overall operation of the electronic device 100, in addition to the operations associated with the application programs. The control unit 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1A, to execute an application program that have been stored in the memory 170. In addition, the controller 180 may control a combination of at least two of those components included in the electronic device 100 to activate the application program.

The power supply unit 190 may be configured to receive external power or provide internal power in order to supply appropriate power required for operating elements and components included in the electronic device 100. The power supply unit 190 may include a battery, and the battery may be configured to be embedded in the terminal body, or configured to be detachable from the terminal body.

At least part of the components may cooperably operate to implement an operation, a control or a control method of an electronic device according to various embodiments disclosed herein. Also, the operation, the control or the control method of the electronic device may be implemented on the electronic device by an activation of at least one application program stored in the memory 170.

Referring to FIGS. 1B and 1C, the disclosed electronic device 100 includes a bar-like terminal body. However, the mobile terminal 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of electronic device. However, such teachings with regard to a particular type of electronic device will generally be applied to other types of electronic devices as well.

Here, considering the electronic device 100 as at least one assembly, the terminal body may be understood as a conception referring to the assembly.

The electronic device 100 will generally include a case (for example, frame, housing, cover, and the like) forming the appearance of the terminal. In this embodiment, the electronic device 100 may include a front case 101 and a rear case 102. Various electronic components are interposed into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of those electronic components mounted to the rear case 102 may include a detachable battery, an identification module, a memory card and the like. Here, a rear cover 103 for covering the electronic components mounted may be detachably coupled to the rear case 102. Therefore, when the rear cover 103 is detached from the rear case 102, the electronic components mounted on the rear case 102 are exposed to the outside. Meanwhile, part of a side surface of the rear case 102 may be implemented to operate as a radiator.

As illustrated, when the rear cover 103 is coupled to the rear case 102, a side surface of the rear case 102 may partially be exposed. In some cases, upon the coupling, the rear case 102 may also be completely shielded by the rear cover 103. Meanwhile, the rear cover 103 may include an opening for externally exposing a camera 121b or an audio output module 152b.

The electronic device 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

The display 151 is generally configured to output information processed in the electronic device 100. For example, the display 151 may display execution screen information of an application program executing at the electronic device 100 or user interface (UI) and graphic user interface (GUI) information in response to the execution screen information.

The display 151 may be implemented using two display devices, according to the configuration type thereof. For instance, a plurality of the displays 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a control unit 180 may generate a control command corresponding to the touch. Contents input in the touch manner may be characters, numbers, instructions in various modes, or a menu item that can be specified.

In this way, the display unit 151 may form a touch screen together with the touch sensor, and in this case, the touch screen may function as the user input unit (123, see FIG.

1A). In some cases, the touch screen may replace at least some of functions of a first manipulation unit 123a.

The first audio output module 152a may be implemented as a receiver for transmitting a call sound to a user's ear and the second audio output module 152b may be implemented as a loud speaker for outputting various alarm sounds or multimedia playback sounds.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the control unit 180 may control the optical output module 154 to stop the light output.

The first camera 121a may process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the electronic device 100. The first and second manipulation units 123a and 123b may also be commonly referred to as a manipulating portion. The first and second manipulation units 123a and 123b may employ any method if it is a tactile manner allowing the user to perform manipulation with a tactile feeling such as touch, push, scroll or the like. The first and second manipulation units 123a and 123b may also be manipulated through a proximity touch, a hovering touch, and the like, without a user's tactile feeling.

On the other hand, the electronic device 100 may include a finger scan sensor which scans a user's fingerprint. The controller 180 may use fingerprint information sensed by the finger scan sensor as an authentication means. The finger scan sensor may be installed in the display unit 151 or the user input unit 123.

The microphone 122 may be configured to receive the user's voice, other sounds, and the like. The microphone 122 may be provided at a plurality of places, and configured to receive stereo sounds.

The interface unit 160 may serve as a path allowing the electronic device 100 to interface with external devices. For example, the interface unit 160 may be at least one of a connection terminal for connecting to another device (for example, an earphone, an external speaker, or the like), a port for near field communication (for example, an Infrared DaAssociation (IrDA) port, a Bluetooth port, a wireless LAN port, and the like), or a power supply terminal for supplying power to the electronic device 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may be arranged in a matrix form. The cameras may be referred to as an 'array camera.' When the second camera 121b is implemented as the array camera, images may be captured in various manners using the plurality of lenses and images with better qualities may be obtained.

The flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement stereophonic sound functions in conjunction with the first audio output module 152a, and may be also used for implementing a speaker phone mode for call communication.

At least one antenna for wireless communication may be disposed on the terminal body. The antenna may be embedded in the terminal body or formed in the case. Meanwhile, a plurality of antennas connected to the 4G wireless communication module 111 and the 5G wireless communication module 112 may be arranged on a side surface of the terminal. Alternatively, an antenna may be formed in a form of film to be attached onto an inner surface of the rear cover 103 or a case including a conductive material may serve as an antenna.

Meanwhile, the plurality of antennas arranged on a side surface of the terminal may be implemented with four or more antennas to support MIMO. In addition, when the 5G wireless communication module 112 operates in a millimeter-wave (mmWave) band, as each of the plurality of antennas is implemented as an array antenna, a plurality of array antennas may be arranged in the electronic device.

The terminal body is provided with a power supply unit 190 (see FIG. 1A) for supplying power to the electronic device 100. The power supply unit 190 may include a batter 191 which is mounted in the terminal body or detachably coupled to an outside of the terminal body.

Hereinafter, description will be given of embodiments of a multi-transmission system and an electronic device having the same, specifically, a power amplifier in a heterogeneous radio system and an electronic device having the same according to the present disclosure, with reference to the accompanying drawings. It will be apparent to those skilled in the art that the present DISCLOSURE may be embodied in other specific forms without departing from the idea or essential characteristics thereof.

Figure 2:
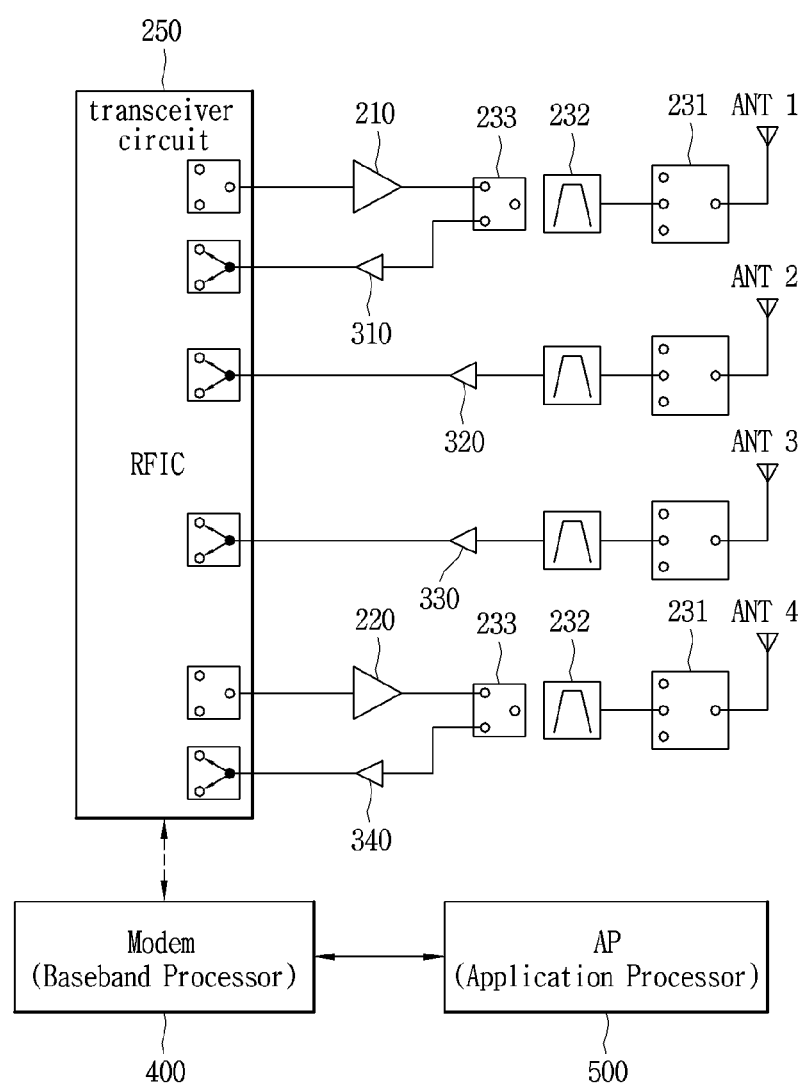
FIG. 2 is a block diagram illustrating a configuration of a wireless communication unit of an electronic device operable in a plurality of wireless communication systems according to the present disclosure.

FIG. 2 is a block diagram illustrating a configuration of a wireless communication unit of an electronic device operable in a plurality of wireless communication systems according to an embodiment. Referring to FIG. 2, the electronic device may include a first power amplifier 210, a second power amplifier 220, and an RFIC 250. In addition, the electronic device may further include a modem 400 and an application processor (AP) 500. Here, the modem 400 and the application processor (AP) 500 may be physically implemented on a single chip, and may be implemented in a logical and functionally separated form. However, the present disclosure is not limited thereto and may be implemented in the form of a chip that is physically separated according to an application.

Meanwhile, the RFIC 250 and the modem 400 may be referred to as a transceiver circuit 250 and a baseband processor 400, respectively.

Meanwhile, the electronic device may include a plurality of low noise amplifiers (LNAs) 410 to 440 in the receiver. Here, the first power amplifier 210, the second power amplifier 220, the RFIC 250, and the plurality of low noise amplifiers 310 to 340 are all operable in a first communication system and a second communication system. In this case, the first communication system and the second communication system may be a 4G communication system and a 5G communication system, respectively.

As illustrated in FIG. 2, the RFIC 250 may be configured as a 4G/5G integrated type, but the present disclosure is not limited thereto. The RFIC 250 may be configured as a 4G/5G separated type according to an application. When the RFIC 250 is configured as a 4G/5G integration type, it is advantageous in terms of synchronization between 4G and 5G circuits, and also there is an advantage that control signaling by the modem 400 can be simplified.

On the other hand, when the RFIC 250 is configured as a 4G/5G separation type, it may be referred to as a 4G RFIC and a 5G RFIC, respectively. In particular, when there is a great difference between a 5G band and a 4G band, such as a case where the 5G band is configured as a mmWave band, the RFIC 250 may be configured as the 4G/5G separated type. As such, when the RFIC 250 is configured as a 4G/5G separation type, there is an advantage that the RF characteristics can be optimized for each of the 4G band and the 5G band.

Meanwhile, even when the RFIC 250 is configured as a 4G/5G separation type, the 4G RFIC and the 5G RFIC may be logically and functionally separated but physically implemented on a single chip.

On the other hand, the application processor (AP) 500 is configured to control the operation of each component of the electronic device. Specifically, the application processor (AP) 500 may control the operation of each component of the electronic device through the modem 400.

For example, the modem 400 may be controlled through a power management IC (PMIC) for low power operation of the electronic device. Accordingly, the modem 400 may operate the power circuits of the transmitter and the receiver in a low power mode through the RFIC 250.

In this regard, when it is determined that the electronic device is in an idle mode, the application processor (AP) 500 may control the RFIC 250 through the modem 400 as follows. For example, when the electronic device is in an idle mode, the application processor 280 may control the RFIC 250 through the modem 400, such that at least one of the first and second power amplifiers 110 and 120 operates in the low power mode or is turned off.

According to another embodiment, the application processor (AP) 500 may control the modem 400 to provide wireless communication capable of performing low power communication when the electronic device is in a low battery mode. For example, when the electronic device is connected to a plurality of entities among a 4G base station, a 5G base station, and an access point, the application processor (AP) 500 may control the modem 400 to enable wireless communication at the lowest power. Accordingly, the application processor (AP) 500 may control the modem 400 and the RFIC 250 to perform short-range communication using only the short-range communication module 113, even at the expense of throughput.

According to another embodiment, when the remaining battery level of the electronic device is above the threshold, the modem 400 may be controlled to select an optimal wireless interface. For example, the application processor (AP) 500 may control the modem 400 to receive data through both the 4G base station and the 5G base station according to the remaining battery level and the available radio resource information. In this case, the application processor (AP) 500 may receive the remaining battery information from the PMIC, and the available radio resource information from the modem 400. Accordingly, when the remaining battery level and the available radio resources are sufficient, the application processor (AP) 500 may control the modem 400 and the RFIC 250 to receive data through both the 4G base station and 5G base station.

Meanwhile, a multi-transceiving system of FIG. 2 may integrate a transmitter and a receiver of each radio system into one transceiver. Accordingly, there is an advantage in that a circuit portion for integrating two types of system signals may be eliminated at a RF front-end.

Furthermore, since the front end parts can be controlled by an integrated transceiver, the front end parts may be more efficiently integrated than when the transceiving system is separated by communication systems.

In addition, when separated by communication systems, it may be impossible to control other communication systems as required, or impossible to perform efficient resource allocation since system delay increases due to this. On the other hand, the multi-transceiving system as illustrated in FIG. 2 has advantages of controlling different communication systems according to necessity and minimizing system delay, which may result in enabling efficient resource allocation.

Meanwhile, the first power amplifier 210 and the second power amplifier 220 may operate in at least one of the first and second communication systems. In this regard, when the 5G communication system operates in a 4G band or a Sub-6 band, the first and second power amplifiers 1210 and 220 may operate in both the first and second communication systems.

On the contrary, when the 5G communication system operates in a millimeter-wave (mmWave) band, the first and second power amplifiers 210, 220 may operate in either the 4G band and the other in the millimeter-wave band.

On the other hand, a transmitter and a receiver may be integrated to implement two different wireless communication systems using a single antenna using a dual transmit/receive antenna. In this case, 4×4 MIMO may be implemented using four antennas as illustrated in FIG. 2. At this time, 4×4 DL MIMO may be performed through downlink (DL).

Meanwhile, when the 5G band is a Sub-6 band, first to fourth antennas ANT1 to ANT4 may be configured to operate in both the 4G band and the 5G band. On the contrary, when the 5G band is a millimeter-wave (mmWave) band, the first to fourth antennas (ANT1 to ANT4) may be configured to operate in either one of the 4G band and the 5G band. In this case, when the 5G band is a millimeter-wave (mmWave) band, a plurality of antennas may be individually configured as an array antenna in the millimeter-wave band.

Meanwhile, 2×2 MIMO may be implemented using two antennas connected to the first power amplifier 210 and the second power amplifier 220 among the four antennas. At this time, 2×2 UL MIMO (2 Tx) may be performed through uplink (UL). Alternatively, the present disclosure is not limited to 2×2 UL MIMO, and may also be implemented as 1 Tx or 4 Tx. In this case, when the 5G communication system is implemented with 1 Tx, only one of the first and second power amplifiers 210, 220 may operate in the 5G band. Meanwhile, when the 5G communication system is implemented using 4Tx, an additional power amplifier operating in the 5G band may be further provided. Alternatively, a transmission signal may be branched in each of one or two transmission paths, and the branched transmission signal may be connected to a plurality of antennas.

On the other hand, a switch-type splitter or power divider is embedded in an RFIC corresponding to the RFIC 250. Accordingly, a separate external component is not needed, thereby improving a component mounting configuration. In more detail, a single pole double throw (SPDT) type switch may be provided in the RFIC corresponding to the controller 250 to select transmitters (TXs) of two different communication systems.

In addition, the electronic device that is operable in the plurality of wireless communication systems according to an embodiment may further include a duplexer 231, a filter 232, and a switch 233.

The duplexer 231 is configured to separate signals in a transmission band and a reception band from each other. In this case, signals in a transmission band transmitted through the first and second power amplifiers 210 and 220 are applied to the antennas ANT1 and ANT4 through a first output port of the duplexer 231. On the contrary, signals in a reception band received through the antennas ANT1 and ANT4 are received by the low noise amplifiers 310 and 340 through a second output port of the duplexer 231.

The filter 232 may be configured to pass signals in a transmission band or a reception band and block signals in the remaining bands. In this case, the filter 232 may include a transmission filter connected to the first output port of the duplexer 231 and a reception filter connected to the second output port of the duplexer 231. Alternatively, the filter 232 may be configured to pass only signals in the transmission band or only signals in the reception band according to a control signal.

The switch 233 is configured to transmit only one of the transmission signal and the reception signal. In an embodiment of the present disclosure, the switch 233 may be configured in a single-pole double-throw (SPDT) type to separate a transmission signal and a reception signal in a time division duplex (TDD) scheme. In this case, the transmission signal and the reception signal are signals of the same frequency band, and thus the duplexer 231 may be implemented as a type of circulator.

Meanwhile, in another implementation of the present disclosure, the switch 233 may also be applied to a frequency division multiplex (FDD) scheme. In this case, the switch 233 may be configured in the form of a double-pole double-throw (DPDT) to connect or block a transmission signal and a reception signal, respectively. On the other hand, the transmission signal and the reception signal may be separated by the duplexer 231, and thus the switch 233 is not necessarily required.

Meanwhile, the electronic device according to the present disclosure may further include a modem 400 corresponding to the controller. In this case, the RFIC 250 and the modem 400 may be referred to as a first controller (or a first processor) and a second controller (a second processor), respectively. On the other hand, the RFIC 250 and the modem 400 may be implemented as physically separated circuits. Alternatively, the RFIC 250 and the modem 400 may be logically or functionally distinguished from each other on one physical circuit.

The modem 400 may perform control of signal transmission and reception through different communication systems using the RFID 250 and processing of those signals. The modem 400 may acquire control information from a 4G base station and/or a 5G base station. Here, the control information may be received through a physical downlink control channel (PDCCH), but the present disclosure is not limited thereto.

The modem 400 may control the RFIC 250 to transmit and/or receive signals through the first communication system and/or the second communication system at specific time and frequency resources. Accordingly, the RFIC 250 may control transmission circuits including the first and second power amplifiers 210 and 220 to transmit a 4G signal or a 5G signal at a specific time interval. In addition, the RFIC 250 may control reception circuits including the first to fourth low noise amplifiers 310 to 340 to receive a 4G signal or a 5G signal at a specific time interval.

Hereinafter, detailed operations and functions of an electronic device having a connector according to the present disclosure that includes the multi-transceiving system as illustrated in FIG. 2 will be discussed. In more detail, an electronic device including a connector for connecting a transceiver circuit and antennas in a multi-transceiving system will be described.

Figure 3A:
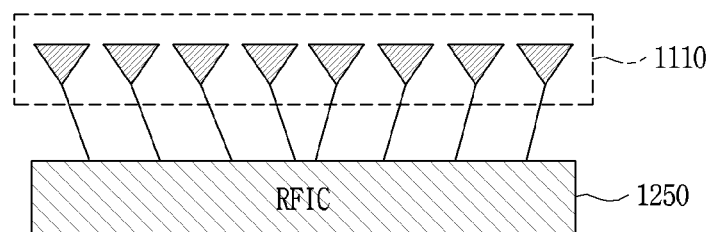
FIG. 3A is a conceptual view illustrating a structure in which a transceiver circuit and antennas are directly connected without a separate connector.
Figure 3B:
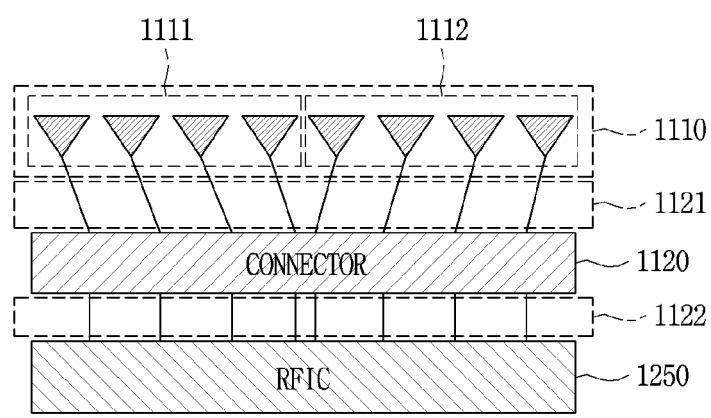
FIG. 3B is a conceptual view illustrating a structure in which a transceiver circuit and antennas are connected to a connector in accordance with the present disclosure.

In this regard, FIG. 3A is a conceptual view illustrating a structure in which a transceiver circuit and antennas are directly connected without a separate connector. FIG. 3B is a conceptual view illustrating a structure in which a transceiver circuit and antennas are connected to a connector in accordance with the present disclosure.

Referring to FIG. 3A, a structure in which an RFIC 1250 as a transceiver circuit and a plurality of antennas 1110 are directly connected without a separate connector is illustrated. In such a structure, there may be a disadvantage in that a performance test on each of the RFIC 1250 and the antennas 1110 is not allowed while the RFIC 1250 and the antenna 1110 are directly connected to each other. This may cause a disadvantage in that the RFIC 1250 and the antenna 1110 must be designed and manufactured in an integrated manner. In addition, if any one of connection parts between the RFIC 1250 and the antennas 1110 has a problem in a connected state, an entire module cannot be used.

Also, in terms of performance, since the RFIC 1250 and the antennas 1110 are directly connected, there may be an issue of heat generation of the RFIC 1250. As the RFIC 1250 and the antennas 1110 are directly connected, an air gap between the antennas 1110 and a device may be required, which may cause a limit to optimal matching.

On the other hand, referring to FIG. 3B, a connector 1120 may be disposed between the plurality of antennas 1110 and the transceiver circuit 1250, and the antennas 1110 and the transceiver circuit 1250 may be connected with each other through the connector 1120. Accordingly, in the state in which the RFIC 1250 and the antennas 1110 are directly connected, a performance test on each of the RFIC 1250 and the antennas 1110 may be allowed. It may also be advantageous that each of the RFIC 1250 and the antennas 1110 can be optimally designed. Even when any one of connection parts between the RFIC 1250 and the antennas 1110 has a problem in a connected state, an entire module can be used by replacing the connector 1120.

Also, in terms of performance, since the RFIC 1250 and the antennas 1110 are not directly connected but connected through the connector 1120, the heat generation issue of the RFIC 1250 can be overcome. As the RFIC 1250 and the antennas 1110 are connected through the connector 1120, the optimal matching can be achieved.

Meanwhile, the number of antennas 1110 is not limited to eight (8), but may be changed to 4, 8, 16, 32, etc. depending on applications. In this case, four antennas among those eight antennas 1110 may be implemented as one array antenna to perform beamforming. Accordingly, multiple input and output (MIMO) may be performed using a first array antenna and a second array antenna each configured with four antennas. Also, when the antennas 1110 support horizontal/vertical (H/V) polarization like a patch antenna, MIMO may be performed according to the H/V polarization.

Accordingly, a maximum of 4×4 MIMO can be performed using the first array antenna, the second array antenna, and the H/V polarization.

On the other hand, there may be a problem in that insertion loss (IL) greatly increases in the case of using an existing SMA type connector in a frequency band like a millimeter-wave band. In this regard, FIG. 4A is a view illustrating insertion loss (IL) and voltage standing wave ratio (VSWR) when the related art connector is used in the same frequency band as a millimeter-wave band.

Referring to (a) of FIG. 4A, the ILs in 28 GHz band and 39 GHz band have values of −6 dB and −12 dB, respectively. Accordingly, as signals received through the antennas in the 28 GHz band and the 39 GHz band pass through the connector, signal amplitudes may be reduced to ¼ and ¹⁄₁₆, respectively. Accordingly, there is a problem that the related art connector cannot be used to connect the antennas and the RFIC in a millimeter-wave band.

Figure 4B:
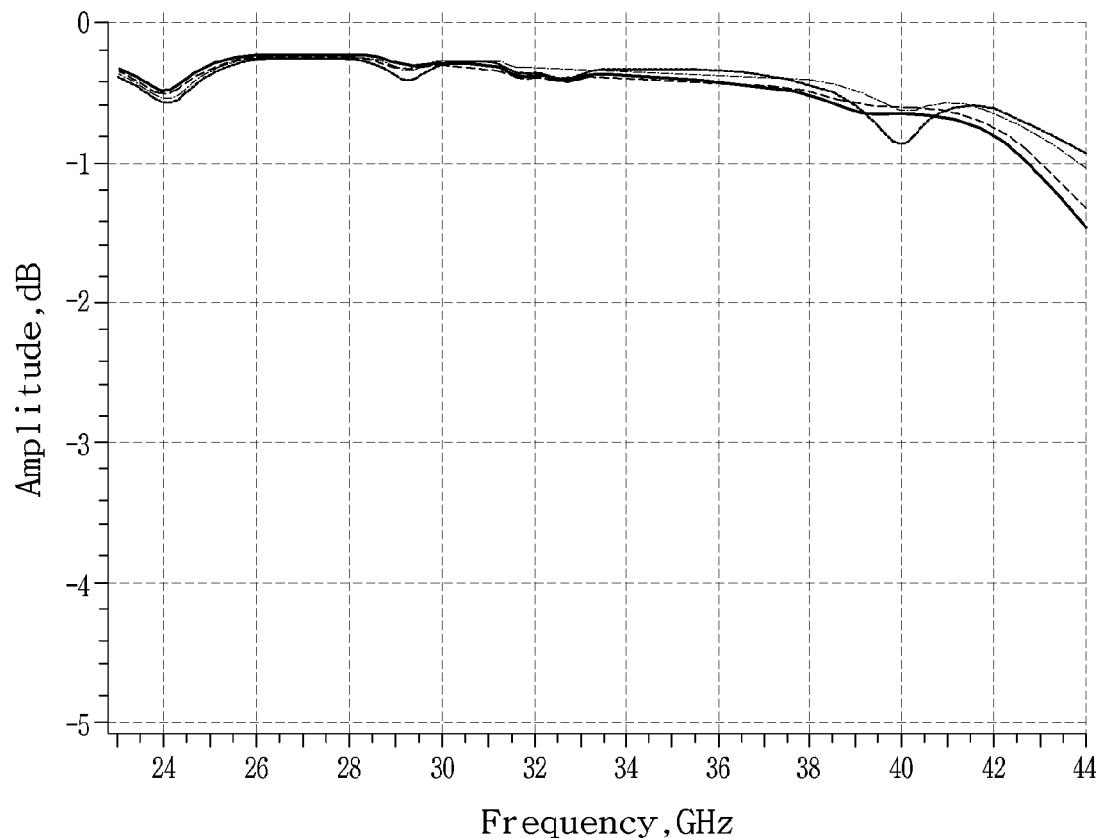
FIG. 4B is a view illustrating insertion loss (IL) of a multilayered PCB connector in accordance with the present disclosure.

On the other hand, FIG. 4B is a view illustrating insertion loss (IL) for a multilayered PCB connector in accordance with the present disclosure. Referring to FIG. 4B, the multilayered PCB connector has very good RF characteristics in that ILs in frequency bands ranging from 23 GHz to 44 GHz including the 28 GHz band and the 39 GHz band are 1.4 dB or less.

Meanwhile, referring to (b) of FIG. 4A, the VSWRs have values of 2 or less in the 28 GHz band and the 39 GHz band. Therefore, it can be seen that signals reflected back to the antennas while passing through the connector after being received through the antennas in the 28 GHz band and the 39 GHz band are negligible. However, similar to (a) of FIG. 4A, the great reduction of the signal amplitudes may be caused while the signals received through the antennas pass through the connector in the 28 GHz band and the 39 GHz band.

Meanwhile, a connector according to the present disclosure may be configured to vertically connect an antenna PCB and an RFIC PCB each having a plurality of layers. In this regard, FIG. 5 is a conceptual view illustrating a connector coupling structure for vertically connecting an RFIC PCB and an antenna PCB each having a plurality of layers in accordance with the present disclosure.

Figure 5:
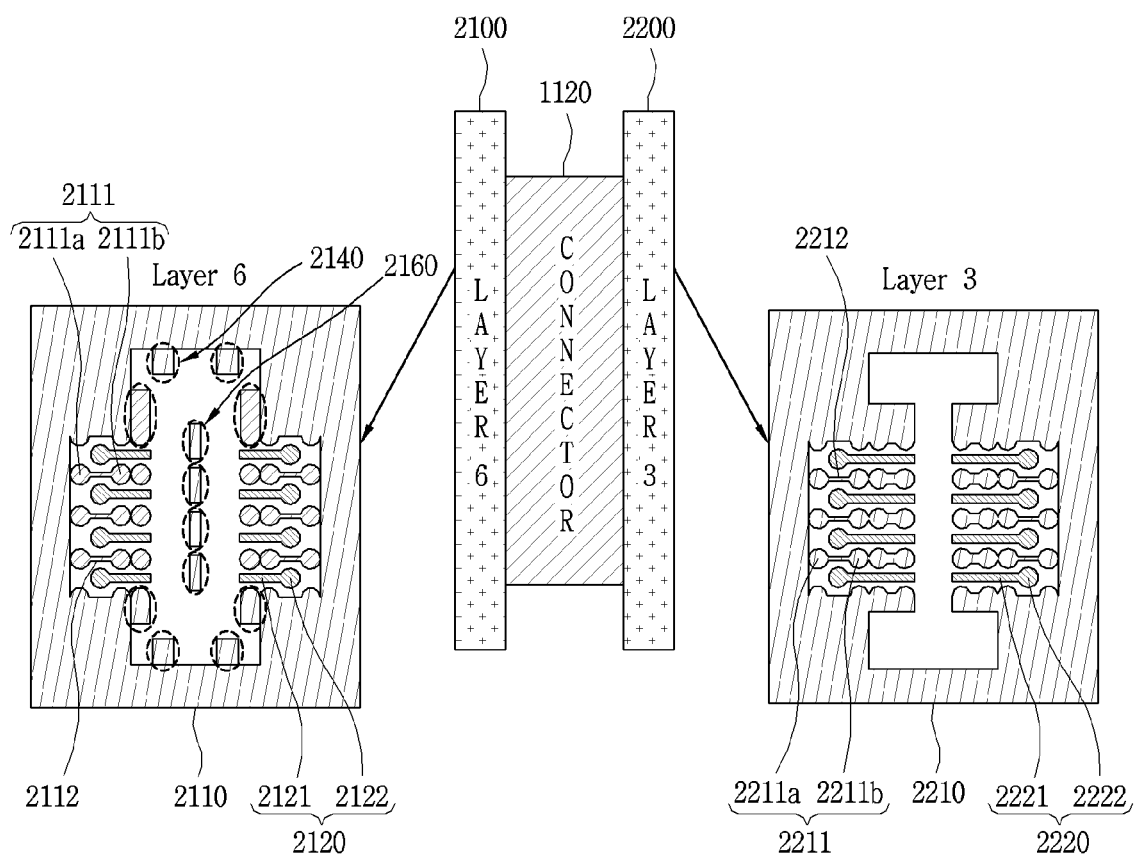
FIG. 5 is a conceptual view illustrating a connector coupling structure for vertically connecting an RFIC PCB and an antenna PCB each having a plurality of layers in accordance with the present disclosure.

Referring to FIG. 5, the RFIC PCB and the antenna PCB may be referred to as a first multilayered printed circuit board (PCB) 2100 and a second multilayered PCB 2200, respectively. In this case, the first multilayered PCB 2100 and the second multilayered PCB 2200 may be configured as a PCB with six layers and a PCB with three layers, respectively. However, the present disclosure is not limited thereto and may vary depending on applications. A connector 1120 may be disposed to connect the first multilayered PCB 2100 as the RFIC PCB and the second multilayered PCB 2200 as the antenna PCB.

Referring to FIGS. 3 and 5, a connector device according to one aspect of the present disclosure is provided. Here, the connector device may include not only the connector 1120 of FIG. 3B but also the first multilayered PCB 2100 and the second multilayered PCB 2200 of FIG. 5.

On the other hand, referring to FIGS. 3, 5 and 7, an electronic device including a connector device according to another aspect of the present disclosure is provided. Here, the electronic device may further include a transceiver circuit (RFIC) 1250 and a baseband processor 1400 of FIG. 7 in addition to the first multilayered PCB 2100 and the second multilayered PCB 2200 of FIG. 5.

The connector device according to the one aspect of the present disclosure may include a first connecting portion 1121 and a second connecting portion 1122. Specifically, the first connecting portion 1121 may include a plurality of terminals connected to the first multilayered PCB 2100. Also, the second connecting portion 1122 may include a plurality of terminals connected to the second multilayered PCB 2200. Here, the number of the plurality of terminals is not limited to eight, and may vary depending on the number of antennas.

Meanwhile, the transceiver circuit 1250 may be disposed on the first multilayered PCB 2100 and the antennas 1110 may be disposed on the second multilayered PCB 2200. At this time, signal transmission lines of the first multilayered PCB 2100 and the second multilayered PCB 2100 may be vertically connected to each other by the first connecting portion 1111 and the second connecting portion 1112 of the connector 1120, such that RF (radio frequency) signals can be transmitted. Specifically, the connector 1120 may allow the transmission of the RF signals between the antennas 1100 and the transceiver circuit 1250 through the first connecting portion 1121 and the second connecting portion 1122.

Referring to FIGS. 3B and 5, the first multilayered PCB 2100 may include the transceiver circuit 1250. And, the second multilayered PCB 2200 may include the antennas 1110. The connector 1120 may be configured to connect the first multilayered PCB 2100 and the second multilayered PCB 2200 to each other. At this time, for convenience of explanation, Layer 6 and Layer 3, which are the uppermost layers of the first multilayered PCB 2100 and the second multilayered PCB 2200, are illustrated. However, the present disclosure is not limited thereto, and may also be applied to arbitrary layers of the first multilayered PCB 2100 and the second multilayered PCB 2200.

Meanwhile, the first multilayered PCB 2100 may include a ground pattern 2110 constituting a ground vertical-connection between different layers. Also, the second multilayered PCB 2200 may include a ground pattern 2210 constituting a ground vertical-connection between different layers.

In this regard, the ground patterns 2110 and 2210 may include ground pads 2111 and 2211, respectively, on which ground vias for the vertical connection between grounds are disposed. The ground patterns 2110 and 2210 may also include ground lines 2112 and 2212, respectively, connecting the ground pads 2111 and 2211. Some of the ground pads 2111 and 2211 may be directly connected without the ground lines 2112 and 2212.

Each of the ground patterns 2110 and 2210 may be provided in plurality to correspond to a plurality of ground terminals of the connector 1120. In this case, signal transmission lines 2120 and 2220 may be disposed between the plurality of ground patterns 2110 and 2210.

Meanwhile, the ground pad 2111 may include first and second circular ground pads 2111a and 2111b having the same circular shape as that of a ground via. In this case, each of the first and second circular ground pads 2111a and 2111b may be connected to a ground line 2112 having a width smaller than diameters of the ground pads 2111a and 2111b. In this regard, by configuring the width of the ground line 2112 to be narrower than the diameters of the first and second circular ground pads 2111a and 2111b, a problem of generating unwanted inductive and capacitive components in the millimeter-wave band can be solved.

The configuration of the ground pad 2111 of the first multilayered PCB 2100 that is the RFIC PCB may also be applicable to the ground pad 2211 of the second multilayered PCB 2200 that is the antenna PCB. Therefore, the ground pad 2211 may include first and second circular ground pads 2211a and 2211b having the same circular shape as that of a ground via. In this case, each of the first and second circular ground pads 2211a and 2211b may be connected to a ground line 2212 having a width smaller than diameters of the ground pads 2211a and 2211b. In this regard, by configuring the width of the ground line 2212 to be narrower than the diameters of the first and second circular ground pads 2211a and 2211b, a problem of generating unwanted inductive and capacitive components in the millimeter-wave band can be solved.

Meanwhile, in relation to a lower bound of the widths of the ground lines 2112 and 2212, when a line-width is narrow, unwanted radiation due to high impedance may occur. However, since the ground lines 2112 and 2212 themselves do not transmit signals, the lower bound of the widths of the ground lines 2112 and 2212 does not matter much.

Signal transmission lines 2120 and 2220 may be disposed between the plurality of ground patterns 2110 and 2210 on the first multilayered PCB 2100 and the second multilayered PCB 2200. Accordingly, the first multilayered PCB 2100 and the second multilayered PCB 2200 may include the signal transmission lines 2120 and 2220, respectively, that constitute a vertical connection for signal transmission between different layers.

The signal transmission lines 2120 and 2220 may include signal pads 2121 and 2221, respectively, on which signal vias for vertical connection for signal transmission are disposed. The signal transmission lines 2120 and 2220 may also include ground lines 2122 and 2222, respectively, connecting the ground pads 2121 and 2221. In this case, the signal lines 2122 and 2222 may have widths smaller than the diameters of the signal pads 2121 and 2221 and extend from the signal pads 2121 and 2221 by predetermined lengths. In this case, the widths of the signal lines 2122 and 2222 may be fixed to a width of a characteristic impedance value, unlike the widths of the ground lines 2112 and 2212. For example, the widths of the signal lines 2122 and 2222 may be set (fixed) to a width of a characteristic impedance value of 50Ω, but may be set to different characteristic impedance values depending on applications.

The signal pads 2121 and 2221 may also be implemented as circular signal pads having the same circular shape as that of the signal via. In this regard, positions on one axis where the plurality of circular signal pads 2121 and 2221 are arranged may be positions where the ground lines 2112 and 2212 are arranged.

Accordingly, it may be optimal to arrange the ground lines 2112 and 2212, other than the ground pads 2111 and 2211, in a space between the plurality of circular signal pads 2121 and 2222. This is because an arrangement space is insufficient if the circular ground pads 2111 and 2211 are disposed in the space between the plurality of circular signal pads 2121 and 2221. In addition, since the first and second circular ground pads 2111a, 2111b, 2211a, and 2211b are disposed adjacent to the signal lines 2122 and 2222, there may be an advantage of implementing a CPW (coplanar waveguide) form.

In this regard, FIG. 6A is a view showing comparison results between a CPW structure based on a circular ground pad according to the present disclosure and the related art CPW structure.

Referring to FIG. 5 and (a) of FIG. 6A, in the circular ground pad-based CPW structure according to the present disclosure, the first and second circular ground pads 2111a, 2111b, 2211a, and 2211b may be disposed adjacent to the signal lines 2122 and 2222 on the same plane. This may result in reducing feeding loss due to unwanted radiation by the signal lines 2122 and 2222. Specifically, the feeding loss can be reduced by the adjacent first and second circular ground pads 2111a, 2111b, 2211a, and 2211b on the same plane.

In this regard, distances between the signal lines 2122 and 2222 and the first and second circular ground pads 2111a, 2111b, 2211a, and 2211b may have values between a minimum value of d and a maximum value of d+r. Here, r denotes the radius of the first and second circular ground pads 2111a, 2111b, 2211a, and 2211b.

As such, as the distances between the signal lines 2122 and 2222 and the first and second circular ground pads 2111a, 2111b, 2211a, and 2211b change, the feeding loss due to unwanted radiation by various forms and aspects can be reduced. For example, the unwanted radiation may be caused due to signals of various frequency bands such as higher-order modes in addition to a specific frequency band. Accordingly, as the distances between the signal lines 2122 and 2222 and the first and second circular ground pads 2111a, 2111b, 2211a, and 2211b change into various forms, an effective response to unwanted radiation signals of various frequency bands can be achieved.

On the other hand, referring to (b) of FIG. 6A, since distances between the signal line and the ground have the same value of d2, signal loss due to unwanted radiation of various shapes and aspects can be reduced. Specifically, when the distance d2 between the signal line and the ground is the maximum distance d+r of (a) of FIG. 6A, an effect by the ground can be reduced. On the other hand, when the distance d2 between the signal line and the ground is the minimum distance d of (a) of FIG. 6A, great changes in characteristics may be caused due to the changes in frequency bands. In addition, when the distance d2 between the signal line and the ground is the minimum distance d of (a) of FIG. 6A, great changes in characteristics may be caused due to a circuit manufacture error.

Figure 6C:
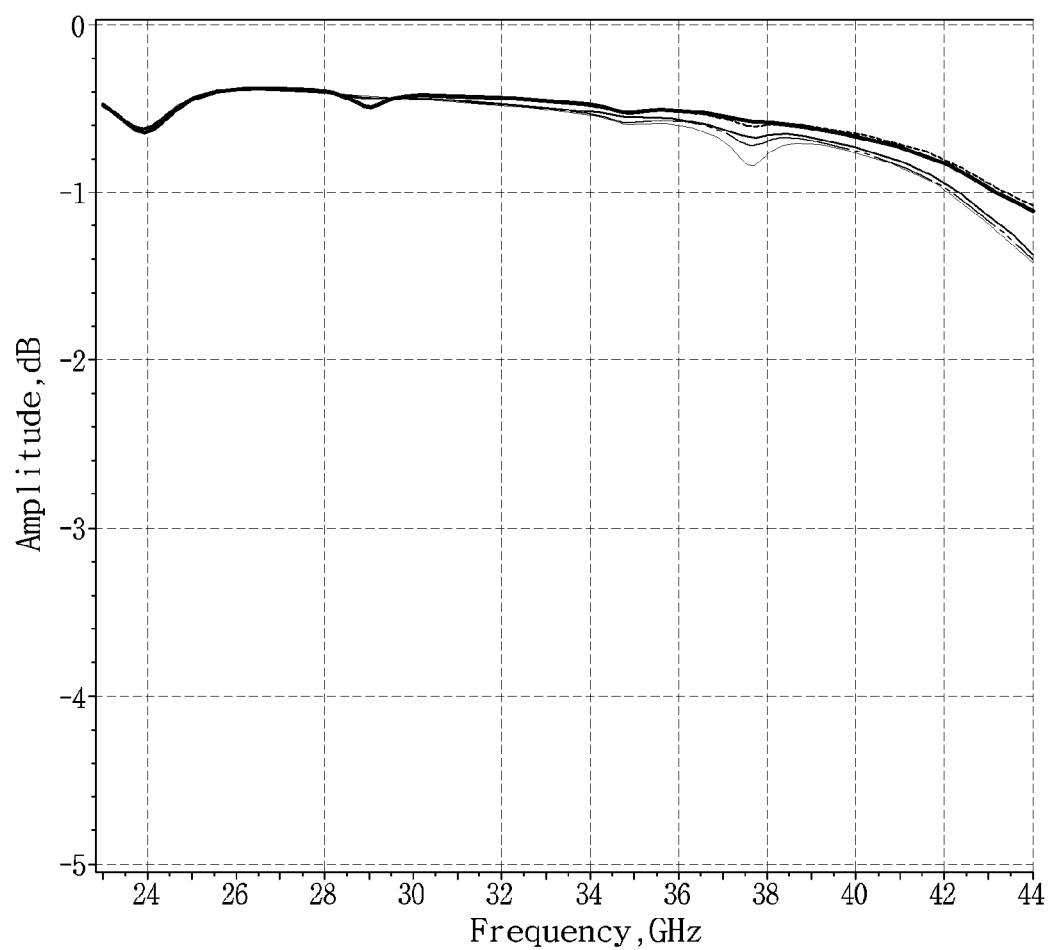
FIGS. 6C and 6D are views illustrating simulation results according to presence or absence of vias and ground patterns according to the present disclosure.
Figure 6D:
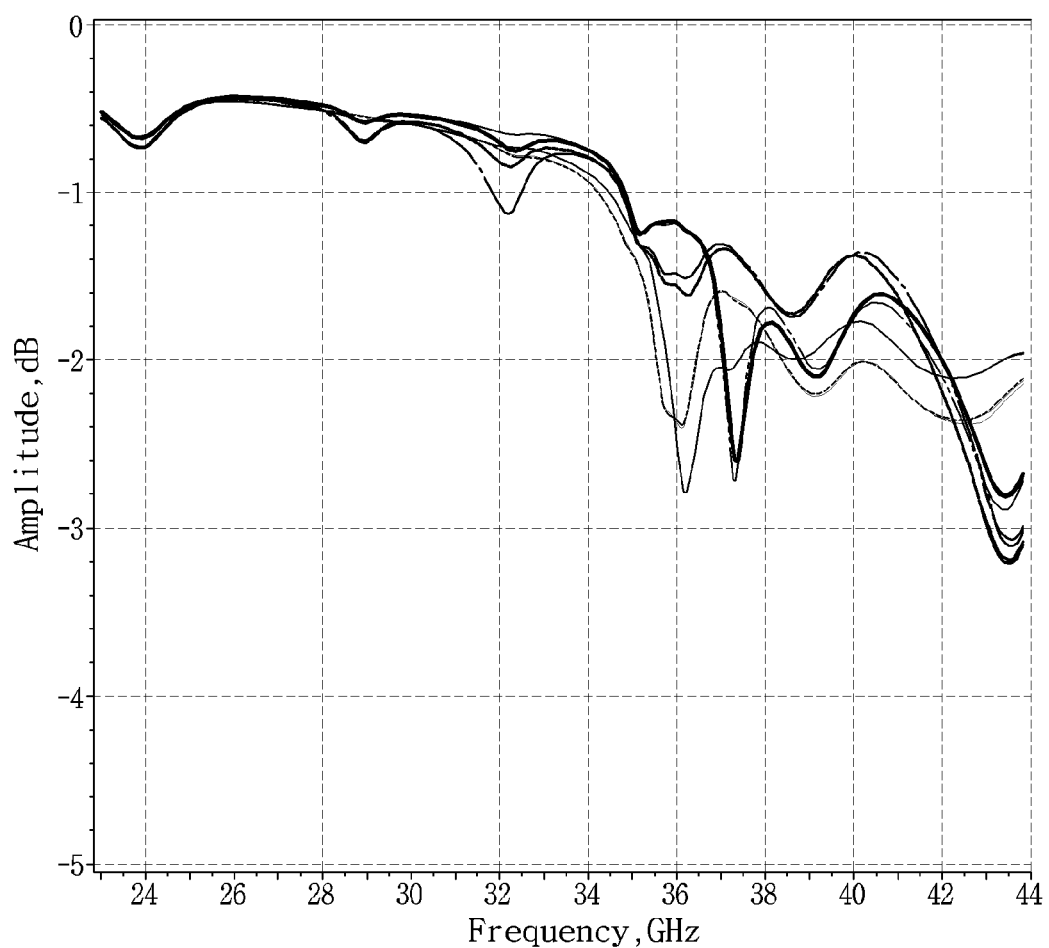

FIG. 6B is a view illustrating a PCB structure according to presence or absence of vias and ground patterns when ground pins are connected according to the present disclosure. Meanwhile, FIGS. 6C and 6D are views illustrating simulation results according to presence or absence of vias and ground patterns according to the present disclosure.

Specifically, FIG. 6C shows insertion loss (IL) at eight terminals when the visa and ground patterns according to the present invention exist. On the other hand, FIG. 6D shows IL at eight terminals when the vias and ground patterns according to the present invention do not exist.

Referring to FIGS. 5 and 6B, a PCB structure according to presence or absence of vias and ground patterns for the second multilayered PCB 2200 corresponding to the three-layer PCB is shown. However, the present disclosure is not limited thereto, and may also be applicable to the first multilayered PCB 2100 corresponding to the six-layer PCB.

Meanwhile, as shown in FIGS. 6B and 6C, it can be seen that the IL characteristics are good in 23 to 44 GHz bands when the vias and the ground patterns are present. On the other hand, as shown in FIGS. 6B and 6C, it can be seen that the IL characteristics are degraded in the 23 to 44 GHz bands when the vias and the ground patterns are not present.

Specifically, Table 1 shows insertion loss (IL), isolation, and return loss (RL) according to presence or absence of vias and ground patterns according to the present disclosure. Here, the values in Table 1 represent the IL values, isolation values, and RL values in the case of the worst performance in the 23 to 44 GHz bands.

TABLE 1

| | Worst IL [dB] | Worst RL [dB] | Worst Isolation [dB] |
|---|---|---|---|
| No vias and ground patterns | −3.2 | −8.7 | 13.7 |
| With vias and ground patterns (Proposed structure) | −1.4 | −11.3 | 17.0 |

Therefore, referring to Table 1, by the addition of the vias and ground patterns, the connector module according to the present disclosure can have very good RF characteristics in that the IL values are 1.4 dB or less in the 23 to 44 GHz bands. On the other hand, when the vias and ground patterns are not disposed around and inside the connector module, more than half of the RF loss occurs in that the ILs are up to 3.2 dB in the 23 to 44 GHz bands.

In addition, as the vias and ground patterns are added, the connector module according to the present disclosure can have very good RF characteristics in that the RL values are −10 hB or less and the isolation values are 17 dB or more in the 23 to 44 GHz bands.

FIG. 7 is a conceptual view illustrating a connection between an RFIC PCB and each terminal of an RFIC according to the present disclosure and a conceptual view of a circuit structure according to the connection.

On the other hand, referring to FIGS. 3, 5 and 7, an electronic device including a connector device according to another aspect of the present disclosure is provided. Here, the electronic device may further include a transceiver circuit (RFIC) 1250 and a baseband processor 1400 of FIG. 7 in addition to the first multilayered PCB 2100 and the second multilayered PCB 2200 of FIG. 5.

As illustrated in (a) of FIG. 7, the ground pattern 2110 of the first multilayered PCB 2100, which is the RFIC PCB, may include a plurality of ground pads 2111 on which ground vias for vertical connection between the grounds are disposed. The ground pattern 2110 may further include ground lines 2112 for connecting the ground pads 2111.

Meanwhile, signal transmission lines 2120 constituting a vertical connection for signal transmission between different layers may be disposed between the plurality of ground lines 2112. In this regard, n signal transmission lines 2120 may be disposed in each of a left region and a right region of the first multilayered PCB 2100. For example, eight signal transmission lines 2120 may be disposed, namely, four in the left region and four in the right region of the first multilayered PCB 2100. In this case, the eight signal transmission lines 2120 may be connected to eight terminals of the RFIC 1250, respectively, to transmit signals from the signal transmission lines 2120 to the RFIC 1250.

Specifically, referring to FIGS. 3B and 7, the baseband processor 1400 may control the transceiver circuit 1250 to perform MIMO using horizontal/vertical (H/V) polarization of the antennas 1110. To this end, a first reception signal and a second reception signal may be simultaneously received during a specific time interval using the H/V polarization of the antennas 1110. Accordingly, the baseband processor 1400 may control the transceiver circuit 1250 to perform the MIMO.

Meanwhile, referring to FIGS. 3B, 5 and 7, each of the first connecting portion 1121 connected to the first multilayered PCB 2100 and the second connecting portion 1122 connected to the second multilayered PCB 2200 may be provided with eight terminals. At this time, the baseband processor 1400 may control a first array antenna 1111 including four antennas connected to four of the eight terminals of the second connecting portion 1122, and a second array antenna 1112 including four antennas connected to the other four terminals. In more detail, the baseband processor 1400 may control the transceiver circuit 1250 to perform the MIMO through the first array antenna 1111 and the second array antenna 1112.

Meanwhile, as illustrated in FIG. 5 and (b) of FIG. 7, an interface between the RFIC 1250 and the connector 1120 may have a strip-line structure. Here, the "strip-line" may be a structure in which ground planes are disposed at both top and bottom with interposing a signal line 2130 therebetween, as illustrated in (b) of FIG. 7.

Referring to (a) of FIG. 7, the eight signal transmission lines 2120 may be disposed on Layer 4 and connected to eight signal lines 2130. In this case, the eight signal lines 2130 disposed on Layer 4 may be arranged in the "strip-line" structure. Accordingly, the ground planes may be disposed on both top and bottom of the eight signal lines 2130 connected to the RFIC 1250. In this case, a direct connection with the RFIC 1250 by the signal transmission lines 2120 without the signal lines 2130 may also be allowed. Here, the signal transmission lines 2120 may be arranged in the strip-line structure.

Figure 8:
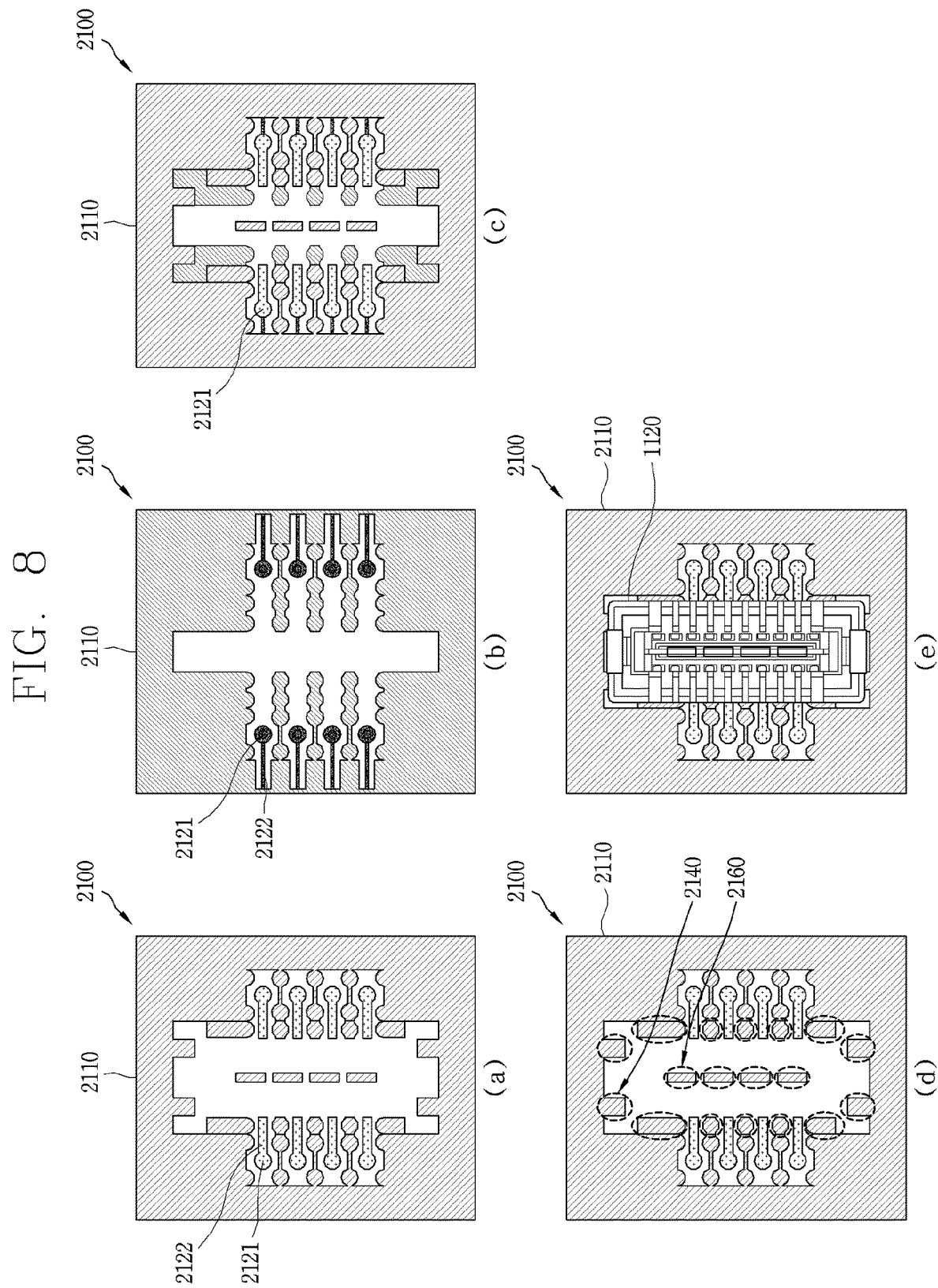
FIG. 8 is a planar view illustrating each of Layer 4 and Layer 6 of an RFIC PCB according to the present disclosure, which illustrates a structure in which Layer 4 and Layer 6 are connected by signal vias and ground vias.

Meanwhile, FIG. 8 is a planar view illustrating each of Layer 4 and Layer 6 of an RFIC PCB according to the present disclosure, which illustrates a structure in which Layer 4 and Layer 6 are connected by signal vias and ground vias.

Specifically, Layer 6 of the first multilayered PCB 2100 that is the RFIC PCB illustrated in (a) of FIG. 8 may correspond to Layer 6 of the first multilayered PCB 2100 that is the RFIC PCB illustrated in FIG. 5. In addition, Layer 4 of the first multilayered PCB 2100 illustrated in (b) of FIG. 8 may correspond to Layer 6 of the first multilayered PCB 2100 illustrated in (a) of FIG. 7.

(c) of FIG. 8 illustrates a configuration in which Layer 4 and Layer 6 of the first multilayered PCB 2100 are connected by signal vias and ground vias. Here, the signal vias may vertically connect the signal pads 2121 of different layers, for example, Layer 4 and Layer 6.

Referring to FIG. 5 and (d) of FIG. 8, Layer 6 of the first multilayered PCB 2100 and the connector 1120 may be connected to each other by connector contact points 2140, 2160. At this time, the ground pattern 2100 of Layer 6 of the first multilayered PCB 2100 may be electrically connected to the ground of the connector 1120 by the connector contact points 2140. A second connector contact points 2160 connected with the connector 1120 is implemented in a floating metal pattern which is disconnected with ground patterns.

Referring to (d) and (e) of FIG. 8, the ground of the connector 1120 may be connected to the ground of Layer 6 of the first multilayered PCB 2100 by the connector contact points 2140. In addition, signal terminals of the connector 1120 may be connected to the signal lines 2122 of Layer 6 of the first multilayered PCB 2100.

Meanwhile, FIG. 9 is a view illustrating a connected state between Layer 4 of the RFIC PCB and connector terminals and a configuration in which the connector is connected to Layers 4 and 6 of the RFIC PCB, according to the present disclosure.

Referring to (a) of FIG. 9, ground terminals of the connector 1120 may be electrically connected to the ground pads 2111 of Layer 4 of the first multilayered PCB 2100 which is the RFIC PCB. In this regard, (b) of FIG. 9 is a lateral view illustrating that the ground terminals of the connector 1120 are electrically connected to the ground pads 2111 of Layer 4 of the first multilayered PCB 2100.

Referring to (d) of FIG. 8 and (c) of FIG. 9, the ground terminals of the connector 1120 may be electrically connected to the ground pads 2111 of Layer 4 of the first multilayered PCB 2100, and also electrically connected to the connector contact points 2140 on the ground of Layer 6.

Figure 10:
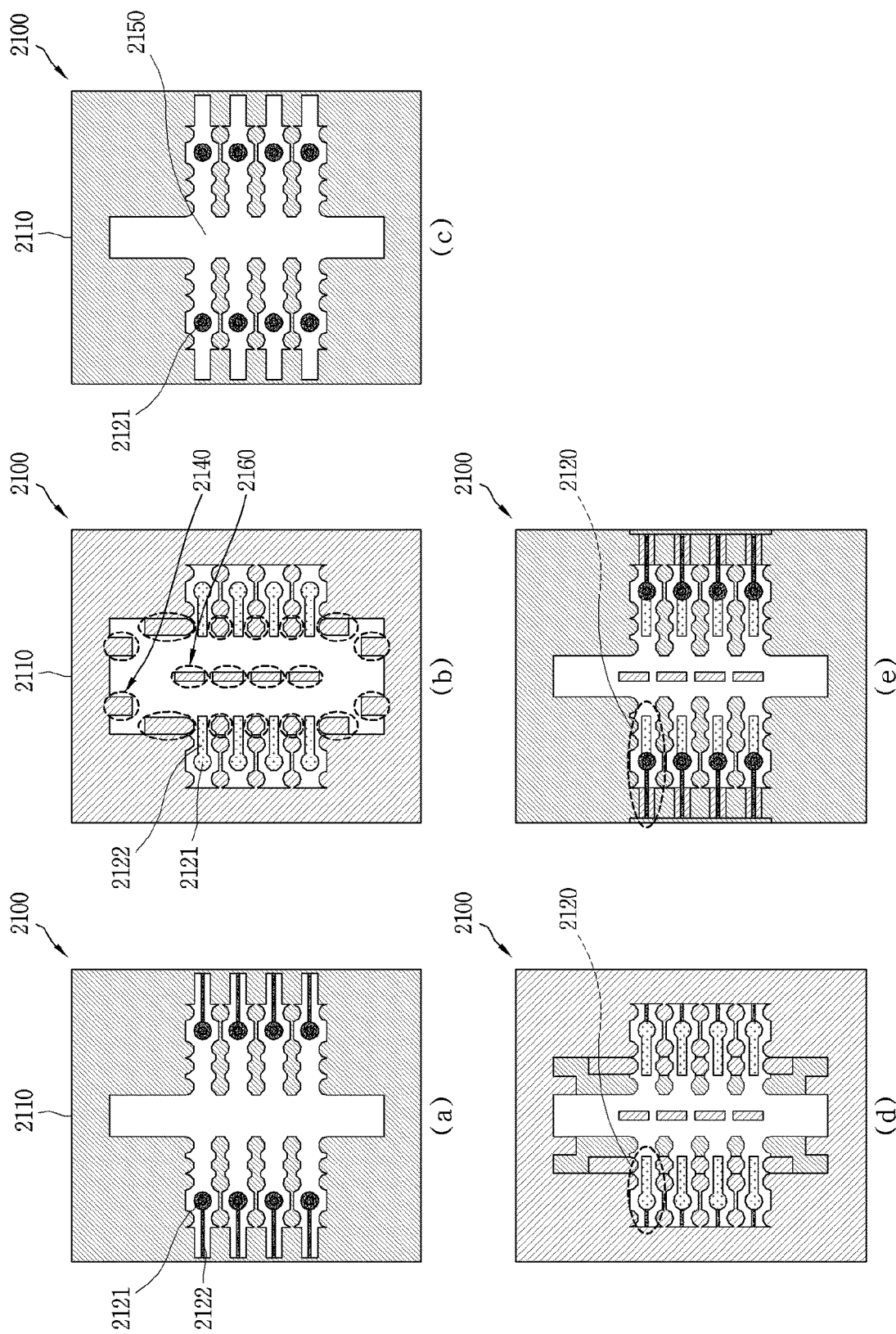
FIG. 10 is a planar view illustrating each of Layers 4, 5, and 6 of an RFIC PCB according to the present disclosure, which illustrates a structure in which Layers 4 to 6 are connected by signal vias and ground vias.

FIG. 10 is a planar view illustrating each of Layers 4, 5, and 6 of the RFIC PCB according to the present disclosure, which illustrates a structure in which Layers 4 to 6 are connected by signal vias and ground vias.

Specifically, Layer 4 of the first multilayered PCB 2100 that is the RFIC PCB illustrated in (a) of FIG. 10 may correspond to Layer 4 of the first multilayered PCB 2100 that is the RFIC PCB illustrated in (b) of FIG. 8. In addition, Layer 6 of the first multilayered PCB 2100 of (b) of FIG. 10 may correspond to Layer 6 of the first multilayered PCB 2100 of (a) of FIG. 8.

Meanwhile, the ground pattern 2110 of Layer 5 of the first multilayered PCB 2100 illustrated in (c) of FIG. 10 may have the same shape as a ground pattern 2110b of Layer 4. Accordingly, the ground patterns 2110 and 2110b may be formed on the same position of different layers of the first multilayered PCB 2100. In addition, a window region 2150 from which a metal pattern is removed may be formed between the adjacent ground patterns 2110 and 2110b on the same position of the different layers of the first multilayered PCB 2100.

Specifically, referring to (a) to (c) of FIG. 10, the signal pads 2121 of Layers 4 to 6 of the first multilayered PCB 2100 may be formed on the same position. On Layers 4 and 6, the signal lines 2122 of the signal transmission line 2120 may be disposed on the left and right sides with respect to the signal pad 2121, respectively. Signals may be transmitted between the connector 1120 and the RFIC 1250 through the signal lines 2122 disposed on the left and right sides with respect to the signal pad 2121. On the other hand, on Layer 5 disposed between Layers 4 and 6, only the signal pad 2121 may be disposed without signal lines.

As such, as the ground patterns 2110 and 2110b and the window region 2150 are formed on the same position between different layers of the first multilayered PCB 2100, distortion of signals transmitted through the signal transmission line 2120 can be prevented. The reason that the signal transmitted through the signal transmission line 2120 is prevented from being distorted may result from that such signal is transmitted through a symmetrical transmission line. A floating metal pattern is disposed at a second connector contact points 2160 in a window region 2150 to tune a radio frequency performance.

Here, "distortion" of a signal may mean loss of a signal transmitted to the RFIC 1250 through the signal transmission line 2120 and the signal line 2130. In this case, the signal loss may include conduction loss of the signal transmission line 2120 and the signal line 2130 and dielectric loss due to permittivity of a substrate. In addition, when the signal transmission line 2120 and the signal line 2130 are implemented as high-impedance lines having a narrow line width or implemented in a bending manner, the signal loss may include radiation loss due to unwanted radiation.

Meanwhile, in order to minimize the signal loss, it may be necessary to use a substrate having a low dielectric constant or to minimize portions of the signal transmission line 2120 and the signal line 2130 having an impedance higher than 50Ω. It may also be necessary to minimize a bending structure between the signal transmission line 2120 and the signal line 2130 or implement the signal line 2130 in a streamlined curved shape as illustrated in (b) of FIG. 7, other than a linear shape.

The signal "distortion" may include a signal distortion due to coupling between adjacent signal transmission lines or between the signal transmission line and the ground, or a signal distortion due to generation of higher-order mode signals in unwanted bands by higher-order modes. Accordingly, in order to prevent a signal distortion due to coupling or higher-order modes, the signal transmission line 2120 and the signal line 2130 may be symmetrically implemented on the same plane. In addition, in order to prevent such signal distortion, the signal transmission lines 2120 may be implemented in a symmetrical structure even on different layers.

With respect to the signal distortion, the symmetrical transmission lines may greatly reduce the distortion of the signal transmitted through the signal transmission line 2120 because peripheral metal patterns on the same plane are symmetrically formed in right and left directions. In addition, since the ground patterns on the top and bottom of the signal transmission line 2120 are also symmetrical, the distortion of the signal transmitted through the signal transmission line 2120 can be further reduced. In addition, the strip-line structure may be implemented as illustrated in (b) of FIG. 7, which may result in more reducing the signal loss or distortion than when a microstrip-line structure is implemented. In this regard, the "microstrip-line" has a form in which the ground is implemented only on a top or bottom of a signal line.

Meanwhile, (d) and (e) of FIG. 10 illustrate a structure in which Layers 4 to 6 of the first multilayered PCB 2100 are electrically connected. Specifically, (d) of FIG. 10 is a front view viewed from Layer 6 in a state in which Layers 4 to 6 of the first multilayered PCB 2100 are connected. In this regard, since the ground pattern 2110 of Layer 5 has the same shape as the ground pattern 2110b of Layer 4, only the state in which the signal transmission line 2120 is interconnected between Layers 5 and 6 may be displayed.

On the other hand, (e) of FIG. 10 is a front view viewed from Layer 4 in a state in which Layers 4 to 6 of the first multilayered PCB 2100 are connected. In this regard, since the ground pattern 2110 of Layer 5 has the same shape as the ground pattern 2110b of Layer 4, only the state in which the signal transmission line 2120 is interconnected between Layers 4 and 6 may be displayed.

Figure 11:
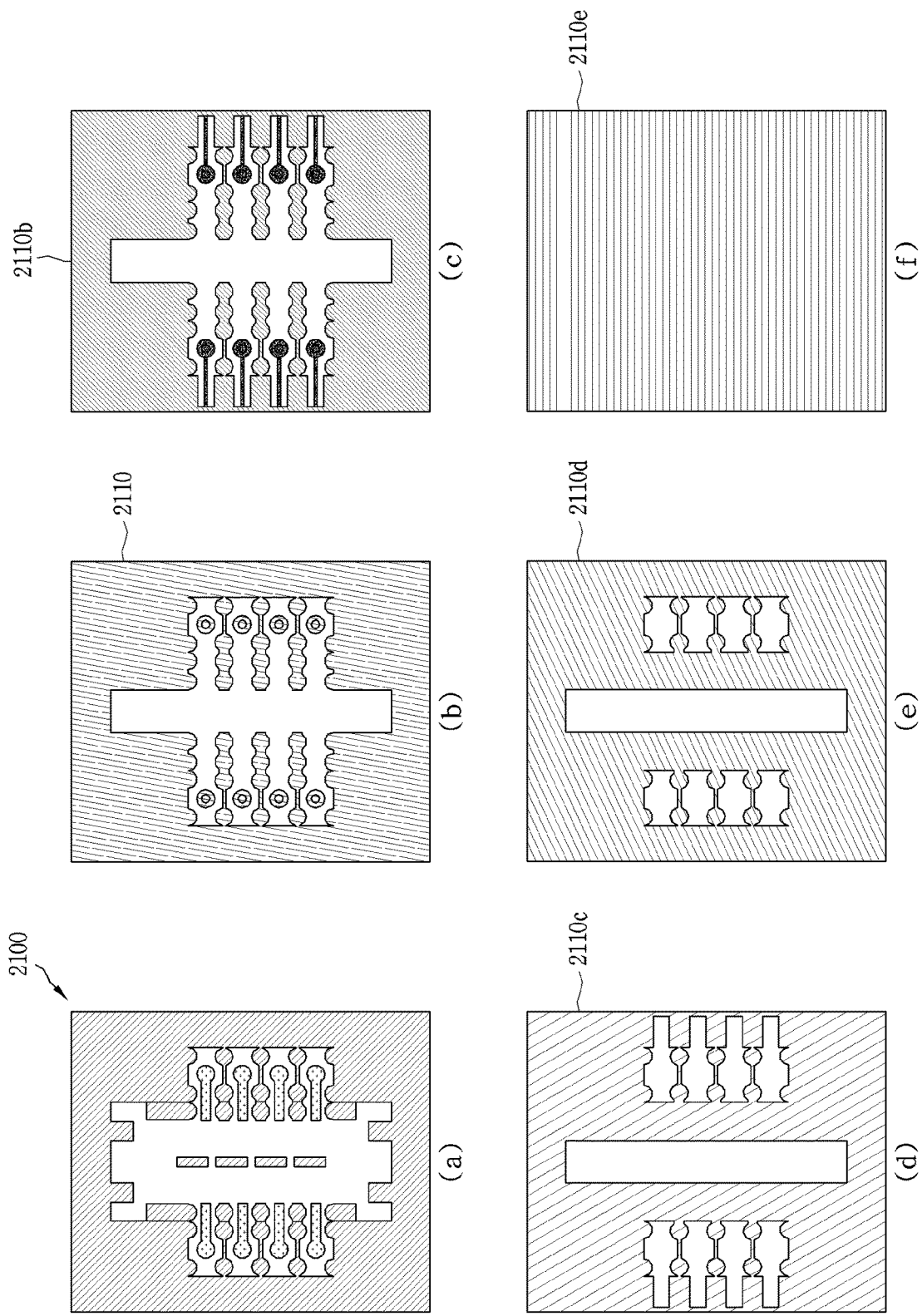
FIG. 11 is a planar view illustrating all of layers of an RFIC PCB according to the present disclosure.

FIG. 11 is a planar view illustrating all of layers of the RFIC PCB according to the present disclosure.

Specifically, (a) to (f) of FIG. 11 correspond to Layers 6 to 1 of the first multilayered PCB 2100, which is the RFIC PCB. As described above, the ground pattern 2110 of Layer 5 illustrated in (b) of FIG. 11 may have the same shape and be disposed at the same position as the ground pattern 2110b of Layer 4 illustrated in (c) of FIG. 11.

Meanwhile, the ground patterns 2110c and 2110d of Layers 3 and 2 of (d) and (e) of FIG. 11 may have different shapes. In this regard, since no signal transmission lines are disposed in Layers 3 and 2, the ground patterns 2110c and 2110d of Layers 3 and 2 may be optimized for optimal RF performance. Therefore, according to the present disclosure, the ground patterns 2110 and 2110b may have the same shape and be disposed at the same position on Layers 5 and 4 where the signal transmission lines are disposed. In addition, the ground patterns 2110c and 2110d may be optimized on Layers 3 and 2 where the signal transmission lines are not disposed, thereby implementing optimal RF performance in terms of signal loss and signal distortion.

Referring to (f) of FIG. 11, only the ground pattern 2110e from which the ground is not removed may exist on Layer 1 of the first multilayered PCB 2100.

Figure 12:
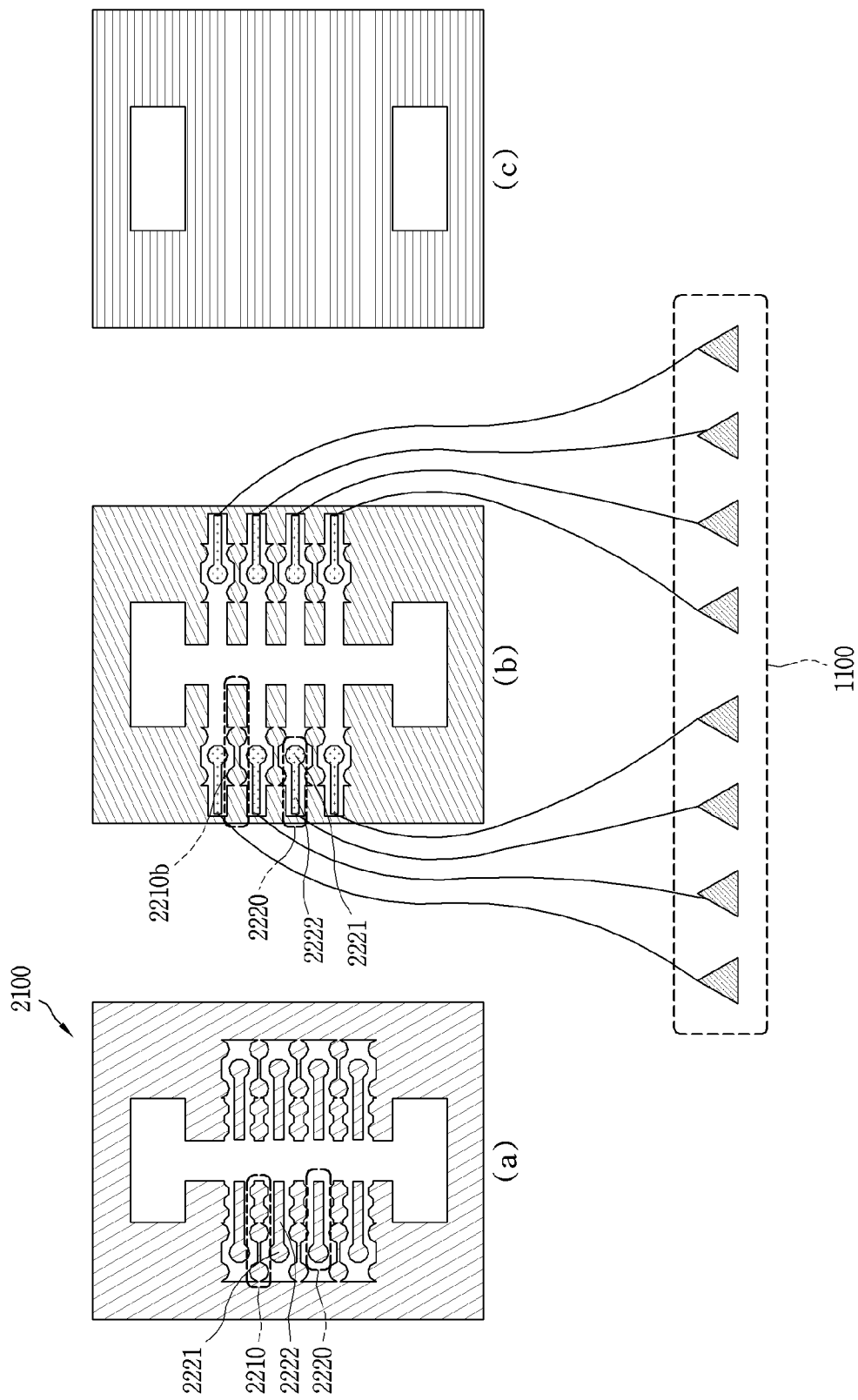
FIG. 12 is a planar view illustrating each of a plurality of layers of an antenna PCB according to the present disclosure.

FIG. 12 is a planar view illustrating each of a plurality of layers of an antenna PCB according to the present disclosure. Referring to (a) of FIG. 12, the plurality of signal transmission lines 2220 may be disposed between ground patterns 2210 on Layer 3 of the second multilayered PCB 2200 that is the antenna PCB. Meanwhile, referring to (b) of FIG. 12, the plurality of signal transmission lines 2220 may also be disposed between ground patterns 2210b on Layer 2 of the second multilayered PCB 2200.

Specifically, referring to (a) to (c) of FIG. 12, the signal pads 2121 of Layers 3 and 2 of the first multilayered PCB 2200 may be formed on the same position. On Layers 3 and 2, the signal lines 2122 of the signal transmission line 2120 may be disposed respectively on the left and right sides with respect to the signal pad 2121. Signals may be transmitted between the connector 1120 and the antennas 1110 through the signal lines 2222 disposed on the left and right sides with respect to the signal pad 2221.

Meanwhile, referring to (c) of FIG. 12, windows from which the ground patterns are removed may be formed on Layer 1 to have the same shape as those on Layers 2 and 3. In this regard, as the windows formed on Layers 1 to 3 have the same shape and are disposed on the same position, the radiation characteristics of the antennas 1110 can be improved. In addition, when the window formed on Layers 1 to 3 is formed by removing even a dielectric as well as a metal, heat generation due to a power amplifier and the like can be eliminated.

Figure 13A:
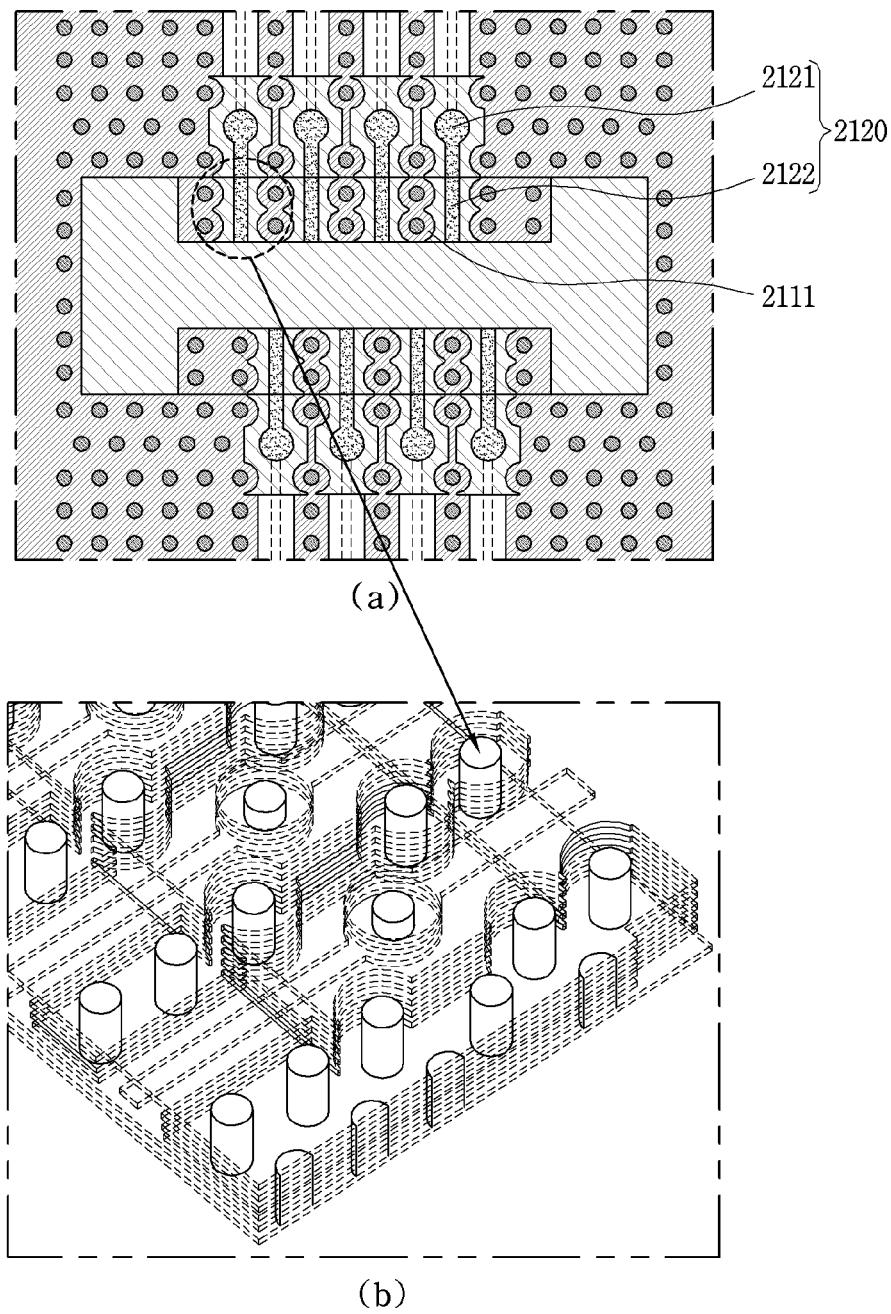
FIG. 13A is a view illustrating a configuration related to optimizing a length of a signal transmission line inside a multilayered PCB connected to a connector according to the present disclosure.

FIG. 13A is a view illustrating a configuration related to optimizing a length of a signal transmission line inside a multilayered PCB connected to a connector according to the present disclosure.

In this regard, as aforementioned, the signal transmission lines 2120 and 2220 may be disposed on the first multilayered PCB 2100 and the second multilayered PCB 2200 between the plurality of ground patterns 2110 and 2210. Referring to (a) of FIG. 13A, in the first multilayered PCB 2100 that is the RFIC PCB, the plurality of signal transmission lines 2120 may be disposed between the plurality of ground patterns 2110. However, the configuration of (a) of FIG. 13A may not be limited to the first multilayered PCB 2100 but may also be applicable to the second multilayered PCB 2200.

In the plurality of signal transmission lines 2120 of (a) of FIG. 13A, the length of the signal line 2122 may be the same as the length of the ground pad 2111. In this regard, when the length of the signal line 2122 is longer than the length of the ground pad 2111, some signal lines cannot be implemented in the CPW structure. On the other hand, when the length of the signal line 2122 is shorter than the length of the ground pad 2111, all signal lines may be implemented in the CPW structure, thereby reducing signal loss in the millimeter-wave band. As the length of the signal line 2122 increases, a contact with the connector 1120 can be stable and the signal loss can be reduced. Accordingly, in the plurality of signal transmission lines 2120, the structure in which the length of the signal line 2122 is equal to the length of the ground pad 2211 can be optimal in terms of RF signal loss and distortion.

On the other hand, (b) of FIG. 13A illustrates a three-dimensional structural view in the case where the length of the signal transmission line inside the multilayered PCB is the same as the length of the ground pad 2211. As described above, the RF signal loss and distortion can be minimized by the structure in which the length of the signal transmission line inside the multilayered PCB is the same as the length of the ground pad 2211.

FIG. 13B is a view illustrating comparison results between a case of an optimized arrangement of a ground region and vias inside the multilayered PCB according to the present disclosure (FIG. 13A) and a case of a non-optimized arrangement (FIG. 13B). Referring to FIG. 13B, when the arrangement of the vias and the ground region inside the multilayered PCB is not optimized, a ground plane on which the vias are disposed may be present on another layer on the same plane as the signal transmission line inside the multilayered PCB. On the other hand, when the arrangement of the ground region and the vias inside the multilayered PCB are optimized, the ground plane on which the vias are disposed on the bottom of the same plane as the signal transmission line may be removed.

Meanwhile, referring to FIGS. 5 and 13B, the optimal arrangement of the ground region and the vias for the first multilayered PCB 2100 corresponding to a six-layer PCB is illustrated. However, the present disclosure is not limited thereto, and may also be applicable to the first multilayered PCB 2200 corresponding to a three-layer PCB.

Figure 13C:
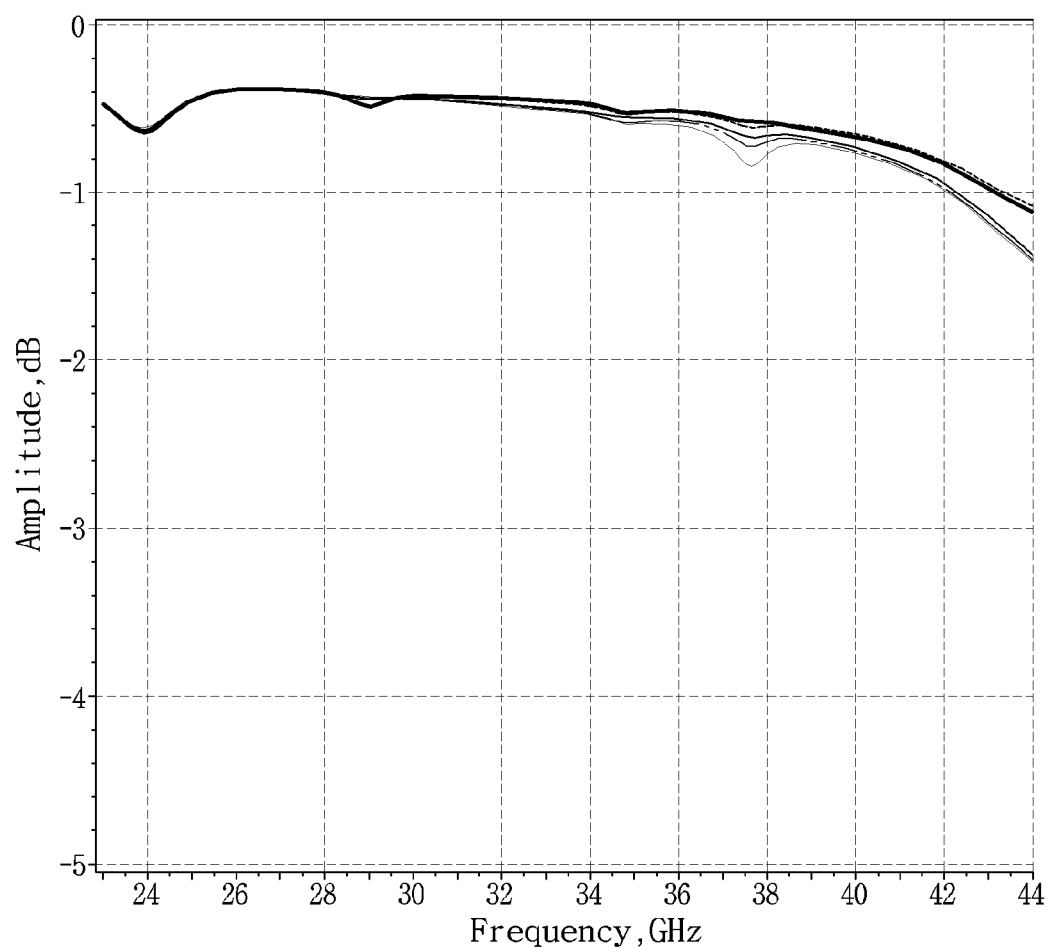
FIGS. 13C and 13D are graphs showing simulation results according to the case of the optimized arrangement of the ground region and the vias inside the multilayered PCB according to the present disclosure and the case of the non-optimized arrangement.
Figure 13D:
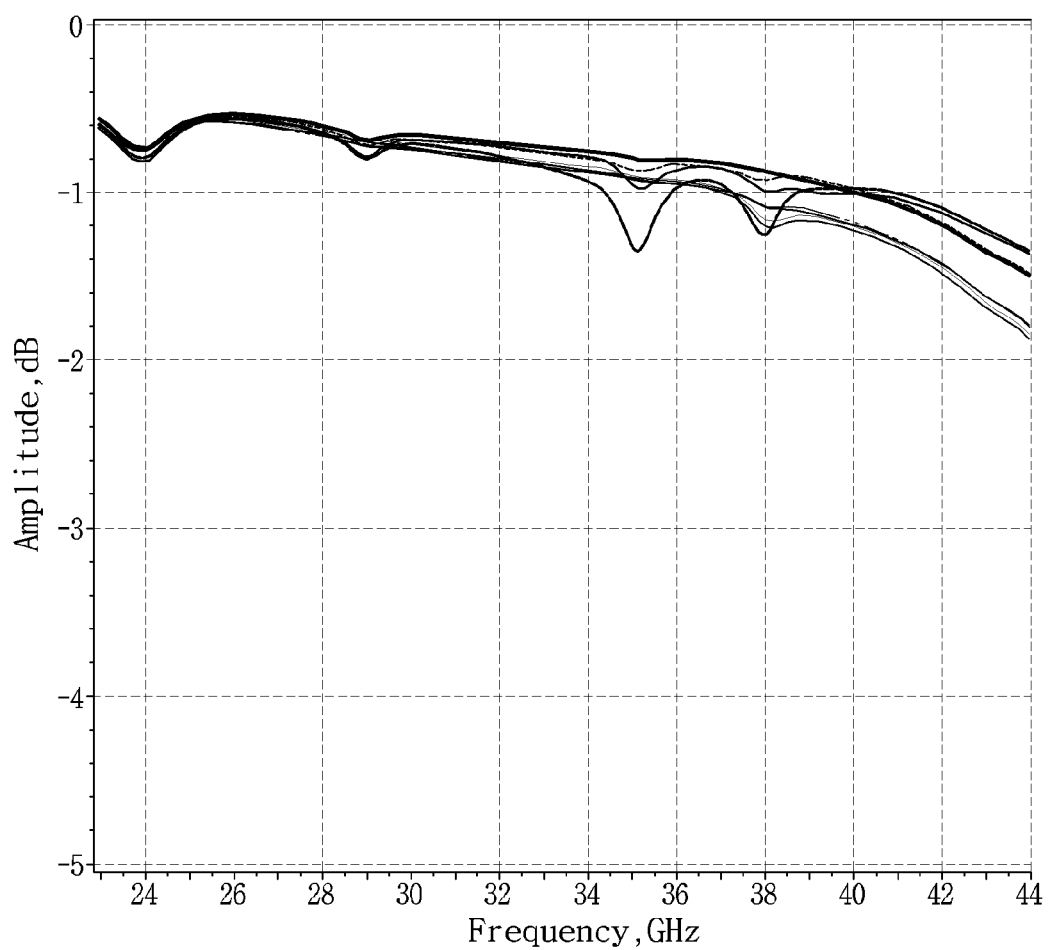

FIGS. 13C and 13D are graphs showing simulation results according to the case of the optimized arrangement of the ground region and the vias inside the multilayered PCB according to the present disclosure and the case of the non-optimized arrangement.

Specifically, FIG. 13C shows insertion loss (IL) at eight terminals when the arrangement of the ground region and the vias inside the multilayered PCB is optimized. On the other hand, FIG. 13D illustrates the insertion loss (IL) at the eight terminals when a ground surface with vias is present on another layer on the same plane as the signal transmission line inside the multilayered PCB according to the present disclosure.

On the other hand, as illustrated in FIGS. 13B and 13C, it can be seen that the IL characteristics are good in 23 to 44 GHz bands when the arrangement of the ground region and the vias inside the multilayered PCB is optimized. On the other hand, as illustrated in FIGS. 13B and 13D, it can be seen that the IL characteristics in the 23 to 44 GHz bands are degraded when a ground plane with vias disposed on another layer on the same plane as the signal transmission line inside the multilayered PCB is present.

Specifically, Table 2 shows IL, isolation, and RL values according to whether or not the arrangement of the vias and the ground region inside the multilayered PCB according to the present disclosure is optimized. Here, the values in Table 2 represent the IL values, isolation values, and RL values in the case of the worst performance in the 23 to 44 GHz bands.

TABLE 2

|  | Worst IL [dB] | Worst RL [dB] | Worst Isolation [dB] |
| --- | --- | --- | --- |
| No optimization of arrangement of ground region and vias | −1.9 | −8.8 | 16.6 |
| Optimization of arrangement of ground region and vias (Proposed structure) | −1.4 | −11.3 | 17.0 |

Therefore, referring to Table 2, by optimizing the arrangement of the ground region and the vias, the connector module according to the present disclosure has very good RF characteristics in that the IL values are 1.4 dB or less in the 23 to 44 GHz bands. On the other hand, when the arrangement of the ground region and vias is not optimized, there is a problem in that the IL values increase up to 1.9 dB in the 23 to 44 GHz bands.

In addition, as the vias and ground patterns are added, the connector module according to the present disclosure has very good RF characteristics in that the RL values are −10 hB or less and the isolation values are 17 dB or more in the 23 to 44 GHz bands.

Figure 14:
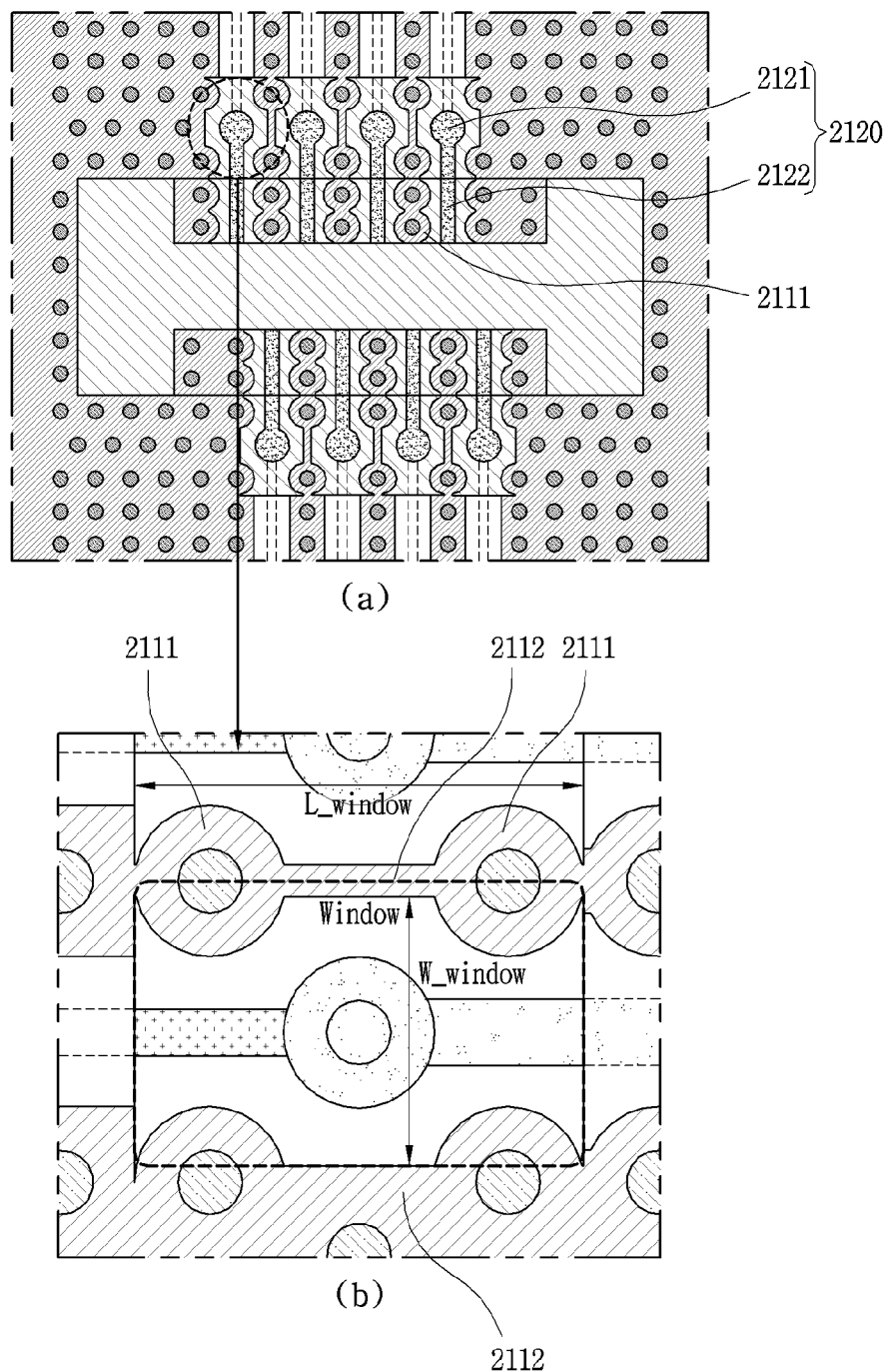
FIG. 14 is a view illustrating a configuration related to an optimization of a window region, from which a metal pattern is removed, in a multilayered PCB connected to a connector according to the present disclosure.

FIG. 14 is a view illustrating a configuration related to an optimization of a window region, from which a metal pattern is removed, in a multilayered PCB connected to a connector according to the present disclosure.

As illustrated in FIG. 5 and (a) of FIG. 14, the size of the window region between the signal lines 2122 and 2222 or the window region between the ground patterns 2110 and 2120 can be optimized in the millimeter-wave band in terms of RF signal loss and distortion. In this regard, an interval W_Window between the plurality of ground lines 2112 and 2212 may be set to be the same as a pin interval of the connector 1120. Therefore, it may be necessary to optimize a length L_Window of the window region including the ground lines 2112 and 2212 and the plurality of ground pads 2111 and 2211 connecting the ground lines 2112 and 2212.

On the other hand, referring to (b) of FIG. 14, in relation to a lower bound of the widths of the ground lines 2112 and 2212, when a line-width is narrow, unwanted radiation due to high impedance may occur. However, since the ground lines 2112 and 2212 themselves do not transmit signals, the lower bound of the widths of the ground lines 2112 and 2212 does not matter much. Accordingly, the widths of the ground lines 2112 and 2212 may be implemented to be as narrow as possible within the limit in which unwanted radiation does not occur. For example, the width of the ground lines 2112 and 2212 may be implemented as 75 µm, but is not limited thereto and may vary depending on applications.

FIG. 15 is a view illustrating a multilayered PCB structure for improving electrical characteristics by signal vias in a multilayered PCB connected to a connector according to the present disclosure, and a hole-type PCB structure for contrast. In this regard, although FIG. 15 illustrates only the first multilayered PCB on which the transceiver circuit is disposed, a multilayered PCB structure for improving electrical characteristics by signal vias may be applied to the second multilayered PCB with the antennas in the same/similar manner.

Specifically, windows 2230 may be disposed as illustrated in FIG. 14 and (a) of FIG. 15. Here, the formation of the "window" means a state in which a metal pattern is removed from a middle substrate disposed between substrates vertically connected by the signal transmission lines. On the other hand, referring to (b) of FIG. 15, holes other than the windows may be formed in the middle substrate disposed between the substrates vertically connected by the signal transmission lines, so that the substrate is partially removed in the form of the hole.

In this regard, the signal transmission lines 2120 or 2220 may be configured to vertically connect different substrates of the first or second multilayered PCB 2100 or 2200 by signal vias. Also, referring to FIG. 14 and (a) of FIG. 15, the windows may be formed in the middle substrate disposed between the vertically connected substrates at positions corresponding to the signal vias to be larger than via pads including the signal vias. Meanwhile, electrical characteristics by the vertically connected signal vias may be improved by the windows.

In this regard, the window design rules may relate to a specific geometry of the via pads including the signal vias. The via pad may be formed larger than the signal via in size but must be formed small enough not to cause RF loss. Meanwhile, the present disclosure proposes an open window structure as a method for compensating for discontinuity of transmission lines in interlayer connections or junctions in the first and second multilayered PCBs 2100 and 2200. In addition, as described above, the size (L_Window and W_Window) of the open window may be tuned for optimal matching of transmission lines including interlayer connections or junctions.

In this regard, FIG. 16 is a view illustrating comparison results of insertion loss between a case with windows according to the present disclosure and a case with holes. (a) of FIG. 16 illustrates the insertion loss in a state in which windows are formed by removing metal patterns from a middle substrate disposed between substrates vertically connected by signal transmission lines. On the other hand, (b) of FIG. 16 illustrates the insertion loss in a state in which holes are formed in the middle substrate disposed between the substrates vertically connected by the signal transmission lines.

Specifically, Table 3 shows IL, isolation, and RL values according to the formation of windows or holes in a multilayered PCB according to the present disclosure. Here, the values in Table 3 represent the IL values, isolation values, and RL values in the case of the worst performance in 23 to 44 GHz bands.

TABLE 3

|  | Worst IL [dB] | Worst RL [dB] | Worst Isolation [dB] |
| --- | --- | --- | --- |
| Hole formed inside multilayered PCB | −1.9 | −7.2 | 18.6 |
| Window formed inside multilayered PCB (Proposed structure) | −1.4 | −11.3 | 17.0 |

Referring to Table 3, when windows are formed by removing metal patterns, the IL is 1.4 dB or less, the RL is −11.3 dB or less, and the isolation value is 17 dB or more, which may result in achieving very good RF characteristics.

On the other hand, when holes are formed in the middle substrate between the signal transmission lines and the substrate is partially removed in the form of the hole, RF characteristics may be deteriorated compared to the case with the windows. In this regard, a case in which a substrate is partially removed in the form of a hole by forming the holes in a middle substrate between signal transmission lines, for example, a case where holes are formed larger than via pads including signal vias may be considered. When the holes are formed in this way, the IL is 1.9 dB, the RL is −7.2 dB, and the isolation is 18.6 dB, resulting in deteriorating RF characteristics.

In relation to such deterioration of the characteristics, as the substrate is partially removed in the form of the hole, a difference of a dielectric constant may occur between an air region from which the substrate is removed and a dielectric region, causing an increase in unwanted radiation due to discontinuity.

FIG. 17 is a view illustrating a shape of a ground in a multilayered PCB on which a connector according to the present disclosure is disposed. Specifically, (a) of FIG. 17 illustrates the first multilayered PCB 2100 in which a ground is removed from a region where the connector according to the present disclosure is disposed. On the other hand, (b) of FIG. 17 illustrates the first multilayered PCB in which a ground exists in a region where the connector is disposed. Such a ground-cut structure may be applicable not only to the first multilayered PCB 2100 but also to the second multilayered PCB 2200 on which the antennas are disposed.

Referring to FIGS. 3B, 5, and 17, an electronic device including a connector device according to another aspect of the present disclosure is provided. Here, the electronic device may further include a transceiver circuit (RFIC) 1250 and a baseband processor 1400 of FIG. 7 in addition to the first multilayered PCB 2100 and the second multilayered PCB 2200 of FIG. 5.

The connector device according to the present disclosure may include a first connecting portion 1121 and a second connecting portion 1122. Specifically, the first connecting portion 1121 may include a plurality of terminals connected to the first multilayered PCB 2100. Also, the second connecting portion 1122 may include a plurality of terminals connected to the second multilayered PCB 2200. Here, the number of the plurality of terminals is not limited to eight, and may vary depending on the number of antennas.

Meanwhile, the transceiver circuit 1250 may be disposed on the first multilayered PCB 2100 and the antennas 1110 may be disposed on the second multilayered PCB 2200. At this time, signal transmission lines of the first multilayered PCB 2100 and the second multilayered PCB 2100 may be vertically connected to each other by the first connecting portion 1111 and the second connecting portion 1112 of the connector 1120, such that RF (radio frequency) signals can be transmitted. Specifically, the connector 1120 may allow the transmission of the RF signals between the antennas 1100 and the transceiver circuit 1250 through the first connecting portion 1121 and the second connecting portion 1122.

In this instance, ground planes may be removed from regions of different substrates of the first and second multilayered PCBs 2100 and 2200 corresponding to the regions in which the connector device is disposed, thereby eliminating a ground resonance phenomenon caused by the connector device and the grounds.

Meanwhile, the signal transmission lines 2120 or 2220 may vertically connect different substrates of the first or second multilayered PCB 2100 or 2200 by signal vias. In this instance, the windows may be formed in a middle substrate disposed between the vertically connected substrates at positions corresponding to the signal vias to be larger than via pads including the signal vias.

In relation to such a connector device, as described above, the configuration of the plurality of ground patterns 2110 and 2210 and the signal transmission lines 2120 and 2220 between the plurality of ground patterns 2110 and 2210 may also be applied to this implementation.

Therefore, the first and second multilayered PCBs 2100 and 2200 may include the ground patterns 2110 and 2210 constituting a ground vertical-connection between different layers. The ground patterns 2110 and 2210 may include ground pads 2111 and 2211 on which ground vias for the ground vertical-connection are disposed, and ground lines 2112 and 2212 connecting the ground pads 2111 and 2211. In this case, the ground patterns 2110 and 2210 may be on the same position of different layers of the first and second multilayered PCBs 2100 and 2200.

Each of the ground patterns 2110 and 2210 may be provided in plurality to correspond to the plurality of ground terminals of the connector device. In this regard, the signal transmission lines 2120 and 2220 may be disposed between the plurality of ground patterns 2110 and 2210. In this case, the signal lines of the signal transmission lines 2120 and 2220 may have a length that is the same as the length of the ground pads 2111 and 2211 of the ground patterns.

Meanwhile, the ground pads 2111 and 2211 each may include first and second circular ground pads having the same circular shape as that of ground vias. In this case, each of the first and second circular ground pads may be connected to the ground line 2112, 2212 having a width narrower than a diameter of the ground pad.

The signal transmission lines 2120 and 2220 may include signal pads 2121 and 2221, respectively, on which signal vias for vertical connection for signal transmission are disposed. In addition, the signal transmission lines 2120 and 2220 may further include signal lines 2123 and 2223, respectively, that are connected to the signal pads 2121 and 2221, have a width narrower than the diameter of the signal pads, and extend by a predetermined length.

Figure 18A:
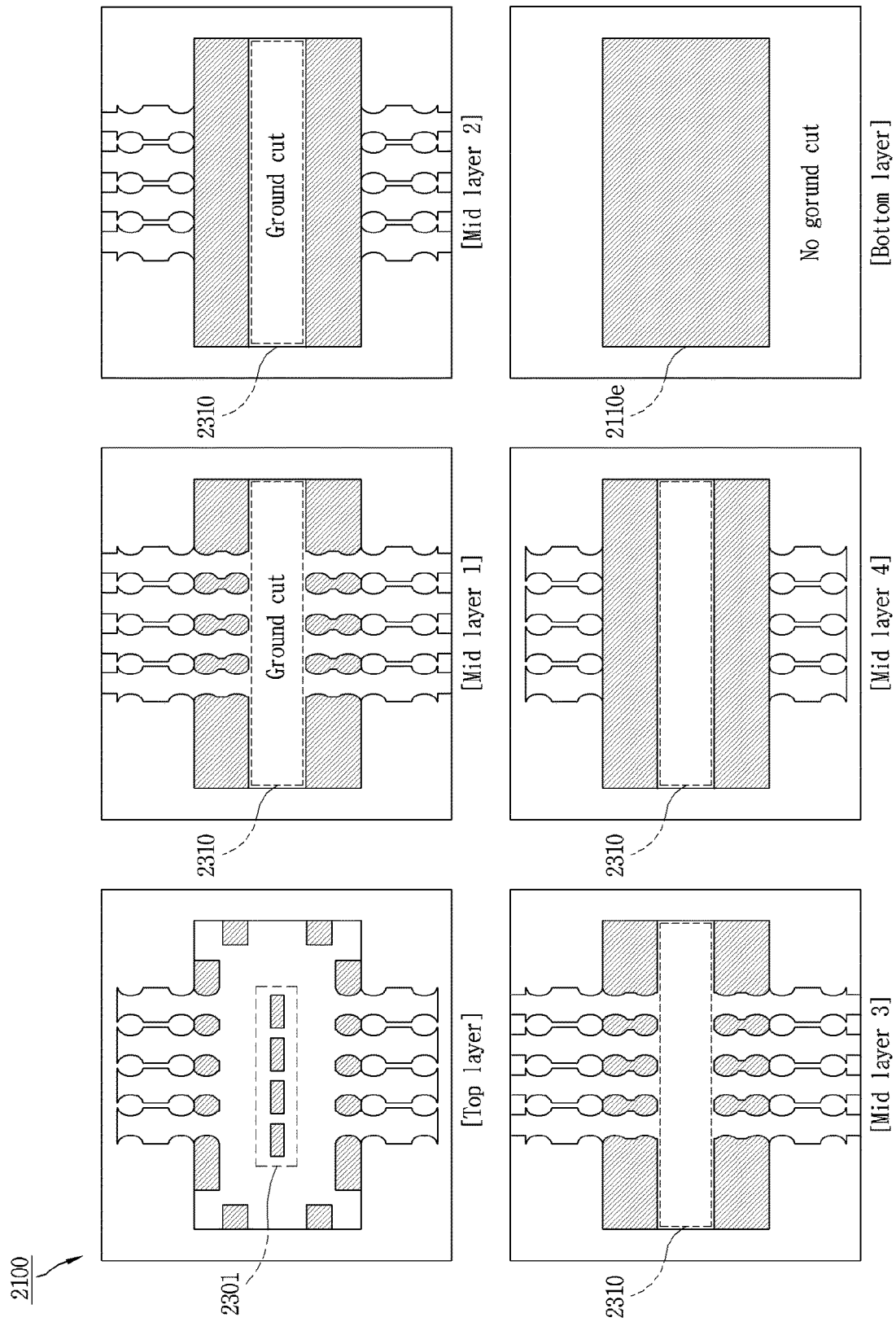
FIG. 18A is a view illustrating a configuration for each layer of a first multilayered PCB according to the present disclosure.
Figure 18B:
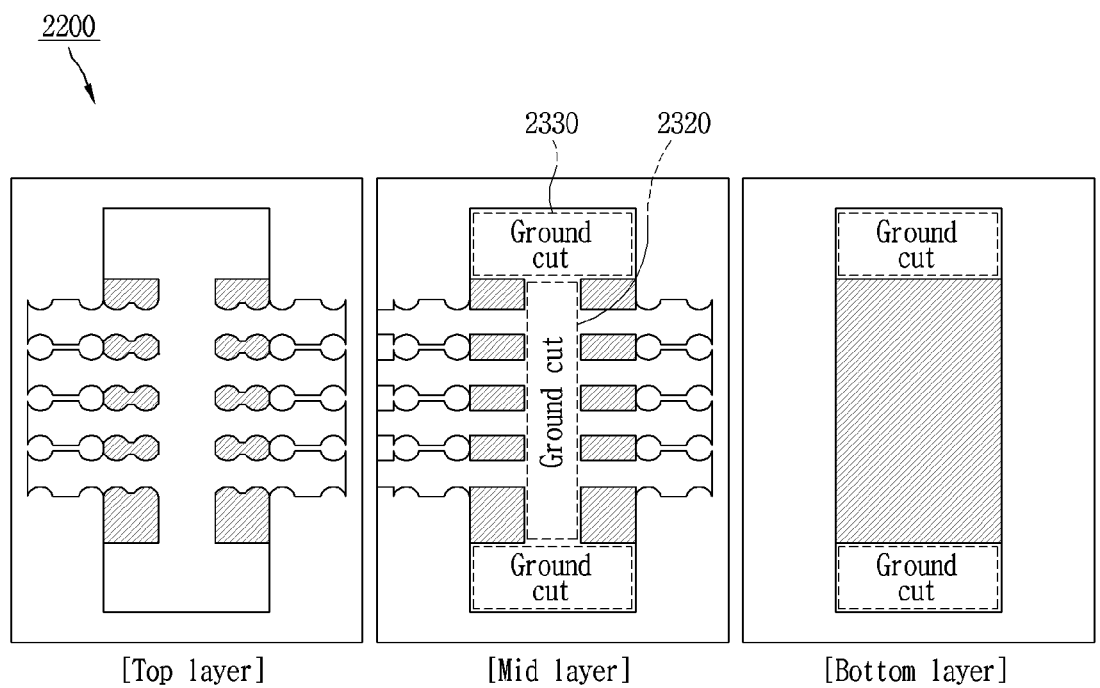
FIG. 18B is a view illustrating a configuration for each layer of a second multilayered PCB according to the present disclosure.

FIG. 18A is a view illustrating a configuration for each layer of a first multilayered PCB according to the present disclosure, and FIG. 18B is a view illustrating a configuration for each layer of a second multilayered PCB according to the present disclosure.

Referring to FIGS. 18A and 18B, ground cuts 2310 and 2320 from which ground planes are removed may be present in regions of different substrates of the first and second multilayered PCBs 2100 and 2200 corresponding to regions in which the connector is disposed. Accordingly, a ground resonance phenomenon caused by the connector and the grounds can be eliminated.

Specifically, referring to FIG. 18A, a top layer of the first PCB 2100 may include connection terminals for electrical connection to the connector and a dummy pattern 2301 for attachment of the connector. Also, an entire bottom layer of the first PCB may be configured as a ground plane 2110*e*. Meanwhile, ground cuts 2310 from which the ground planes are removed in the same shape from regions corresponding to regions where the connector is disposed may be formed in the plurality of middle layers between the top layer and the bottom layer. As such, the ground resonance phenomenon caused due to the connector and the grounds can be eliminated by the ground cuts 2310 from which the ground planes are removed in the same shape.

Also, referring to FIG. 18B, a top layer of the second PCB 2200 may include connection terminals for electrical connection to the connector. However, a dummy pattern for attaching the connector may not be provided in an inner region of the second PCB 2200. As described above, since the second PCB 2200 on which the antennas are disposed does not include the dummy pattern, a phenomenon in which radiation performance of the antennas is deteriorated due to the dummy pattern can be prevented.

Meanwhile, a ground cut 2320 from which the ground plane is removed from a region corresponding to the region where the connector is disposed may be present in a middle layer between the top layer and the bottom layer. In addition, the bottom layer of the second PCB 2200 may be configured such that the ground is partially removed from both sides. Accordingly, second ground cuts 2330 from which the ground is removed may be present on both sides of the bottom layer of the second PCB 2200. Also, both the ground cut 2320 and the second ground cuts 2330 may be disposed in the middle layer.

Accordingly, the ground of the bottom layer may operate as a ground of the antennas in the second PCB 2200 on which the antennas are disposed. On the other hand, changes in antenna performance due to unnecessary grounds can be prevented by the ground cut 2320 and the second ground cuts 2330 present on the middle layer.

FIG. 19 is a view illustrating comparison results of insertion loss according to presence or absence of a ground cut according to the present disclosure. Referring to (a) of FIG. 15 and (a) of FIG. 19, it can be seen that the IL is improved as compared to (b) of FIG. 19 as the ground resonance phenomenon is eliminated by the ground cuts from which the grounds are removed.

In this regard, Table 4 shows IL, isolation, and RL values according to presence or absence of a ground cut inside a multilayered PCB according to the present disclosure.

TABLE 4

|  | Worst IL [dB] | Worst RL [dB] | Worst Isolation [dB] |
| --- | --- | --- | --- |
| No ground cut inside multilayered PCB | −1.9 | −7.2 | 18.6 |
| Presence of ground cut inside multilayered PCB (Proposed structure) | −2.1 | −10.3 | 15.3 |

Referring to Table 4, when the ground-cut structure from which the grounds are removed is optimized, the IL is 1.4 dB or less, the RL is −11.3 dB or less, and the isolation value is 17 dB or more, which may result in achieving very good RF characteristics.

On the other hand, when the ground is not removed, RF characteristics may be deteriorated. As such, when the ground is not removed from the middle layer, the IL is 2.1 dB, the RL is −10.3 dB, and the isolation is 15.3 dB, which may cause deterioration of the RF characteristics.

On the other hand, Table 5 shows comparison results of electrical characteristics for the connector between a case considering several design rules according to the present disclosure and comparative cases without considering the design rules. Here, first to fourth design rules may be as shown in Tables 1 to 4. That is, the first to fourth design rules may correspond to 1) presence or absence of the vias and ground patterns, 2) whether or not the arrangement of the ground region and vias in the multilayered PCB is optimized, 3) formation or non-formation of the windows inside the multilayered PCB, and 4) presence or absence of the ground cuts inside the multilayered PCB. Meanwhile, Table 5 also shows results for a comparative case without considering any of the first to fourth design rules, in addition to the comparative cases corresponding to Table 1 to Table 4. In this way, when all rules are ignored, the IL is 5.5 dB, the RL is −8.7 dB, and the isolation is 13.7 dB, which causes drastic deterioration of the RF characteristics.

TABLE 5

|  | Worst IL [dB] | Worst RL [dB] | Worst Isolation [dB] |
| --- | --- | --- | --- |
| Ignore 1$^{st}$ Rule | −3.2 | −8.7 | −13.7 |
| Ignore 2$^{nd}$ Rule | −1.9 | −8.8 | −16.7 |
| Ignore 3$^{rd}$ Rule | −1.9 | −7.2 | −18.6 |
| Ignore 4$^{th}$ Rule | −2.1 | −10.3 | −15.3 |
| Ignore all Rules | −5.5 | −7.1 | −9.4 |
| Proposed Structure | −1.4 | −11.3 | −17.0 |

The foregoing description has been given of an electronic device having a connector for connecting antennas and a transceiver circuit according to the present disclosure. Meanwhile, technical effects of the electronic device having the connector for connecting the antennas and the transceiver circuit according to the present disclosure will be described as follows.

According to at least one implementation of the present disclosure, when vertically connecting antennas and a transceiver circuit in a millimeter-wave band, a connector that is capable of reducing insertion loss by optimizing circuit patterns around vertical vias can be provided.

In addition, according to at least one implementation of the present disclosure, a connector that is capable of reducing insertion loss due to radiation by vertical vias when a length of the vertical vias increases due to a vertical connection between antennas and a transceiver circuit in a millimeter-wave band, and an electronic device having the same can be provided.

[Common End]

According to at least one implementation of the present disclosure, structure and shape of ground patterns inside a multilayered PCB connected to a connector device can be optimized for each layer, so as to improve performance of the connector device according to optimal matching between transmission lines and grounds.

According to at least one implementation of the present disclosure, structure and shape of ground patterns inside a multilayered PCB connected to a connector device can be optimized for each layer, so as to prevent deterioration of performance of the connector device due to resonance between antennas connected to the connector and grounds.

[Common Start]

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

In relation to the aforementioned present disclosure, design and operations of a connector device for connecting antennas and a transceiver circuit disposed on multilayered PCBs can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller 180, 1400 of the terminal. Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

What is claimed is:

1. An electronic device comprising:
a first multilayered printed circuit board (PCB) including a transceiver circuit;
a second multilayered PCB including antennas; and
a connector to connect the first multilayered PCB and the second multilayered PCB through a plurality of terminals,
wherein the first and second multilayered PCBs each includes signal transmission lines vertically connected for signal transmission between different layers thereof,
wherein the first and second multilayered PCBs each includes a plurality of ground patterns adjacent to one another to constitute a ground vertical-connection between different substrates, and wherein window regions from which metal patterns are removed are formed between the adjacent ground patterns at the same position of different layers of the first and second multilayered PCBs, so as to improve a matching characteristic at the vertically connected signal transmission lines.

2. The electronic device of claim 1, wherein the signal transmission lines vertically connect different substrates of the first or second multilayered PCB by signal vias, wherein the windows are formed in a middle substrate disposed between the vertically connected substrates at positions corresponding to the signal vias to be larger than via pads including the signal vias, and wherein electrical characteristics by the vertically connected signal vias are improved by the windows.

3. The electronic device of claim 2, wherein the signal transmission line comprises:

signal pads on which signal vias configuring a vertical connection for signal transmission between the different substrates are disposed; and a signal line connected to the signal pads, having a width narrower than a diameter of the signal pads, and extending by a predetermined length.

4. The electronic device of claim 1, wherein ground planes are removed from regions of different substrates of the first and second multilayered PCBs corresponding to regions in which the connector is disposed, so as to eliminate a ground resonance phenomenon caused by the connector and the grounds.

5. The electronic device of claim 4, wherein a top layer of the first multilayered PCB includes connection terminals for electrical connection with the connector and a dummy pattern for attachment of the connector, wherein an entire bottom layer of the first multilayered PCB is configured as a ground plane, and wherein the ground planes are removed in the same shape from a plurality of middle layers between the top layer and the bottom layer in regions corresponding to regions where the connector is disposed.

6. The electronic device of claim 4, wherein a top layer of the second multilayered PCB includes connection terminals for electrical connection with the connector, wherein a bottom layer of the second multilayered PCB is configured such that a ground is partially removed from both sides thereof, wherein the ground plane is removed from a middle layer between the top layer and the bottom layer in a region corresponding to a region where the connector is disposed, and wherein a dummy pattern for the attachment of the connector is not provided on a top of the second multilayered PCB.

7. The electronic device of claim 1, wherein the ground patterns each comprises:

ground pads on which ground vias for the ground vertical-connection are disposed; and ground lines connecting the ground pads, and wherein the ground patterns are formed on the same position of different layers of the first and second multilayered PCBs.

8. The electronic device of claim 7, wherein the ground pattern is provided in plurality to correspond to a plurality of ground terminals of the connector, wherein the signal transmission line is disposed between the plurality of ground patterns, and wherein a length of a signal line of the signal transmission line is the same as a length of a ground pad of the ground pattern.

9. The electronic device of claim 7, wherein the ground pad includes first and second circular ground pads each having the same circular shape as that of the ground via, and wherein each of the first and second circular ground pads is connected to the ground line having a width narrower than a diameter of the ground pad.

10. The electronic device of claim 1, further comprising a transceiver circuit to receive signals from the antennas through different signal terminals of the connector or transmit signals to the antennas through the different signal terminals of the connector.

11. The electronic device of claim 10, further comprising a baseband processor to control a first reception signal and a second reception signal received from the antennas to the transceiver circuit through different signal terminals of the connector.

12. The electronic device of claim 11, wherein each of a first connecting portion connected to the first multilayered PCB and a second connecting portion connected to the second multilayered PCB comprises eight terminals, and wherein the baseband processor controls the transceiver circuit to perform MIMO through a first array antenna including four antennas connected four of the eight terminals of the second connecting portion and a second array antenna including four antennas connected to remaining four terminals of the second connecting portion.

13. A connector device comprising:

a first connecting portion having a plurality of terminals to be connected to a first multilayered printed circuit board (PCB); and a second connecting portion having a plurality of terminals to be connected to a second multilayered PCB, wherein signal transmission lines of the first multilayered PCB and the second multilayered PCB are vertically connected to each other by the first connecting portion and the second connecting portion, to transmit Radio Frequency (RF) signals, and wherein ground planes are removed from regions of different substrates of the first and second multilayered PCBs corresponding to regions where the connector is disposed, to eliminate a ground resonance phenomenon caused due to the connector and the grounds.

14. The connector device of claim 13, wherein a top layer of the first multilayered PCB includes connection terminals for electrical connection with the connector and a dummy pattern for attachment of the connector, wherein an entire bottom layer of the first multilayered PCB is configured as a ground plane, and wherein the ground planes are removed in the same shape from regions corresponding to regions where the connector is disposed in a plurality of middle layers between the top layer and the bottom layer.

15. The connector device of claim 13, wherein a top layer of the second multilayered PCB includes connection terminals for electrical connection with the connector, wherein a bottom layer of the second multilayered PCB is configured such that a ground is partially removed from both sides thereof, wherein the ground plane is removed from a region corresponding to a region where the connector is disposed in a middle layer between the top layer and the bottom layer, and wherein a dummy pattern for the attachment of the connector is not provided on a top of the second multilayered PCB.

16. The connector device of claim 13, wherein the first and second multilayered PCBs each includes signal transmission lines vertically connected for signal transmission between different layers thereof, wherein the first and second multilayered PCBs each includes a plurality of ground patterns adjacent to one another to constitute a ground vertical-connection between different substrates, and wherein window regions from which metal patterns are removed are formed between the adjacent ground patterns at the same position of different layers of the first and second multilayered PCBs, so as to improve a matching characteristic at the vertically connected signal transmission lines.

17. The connector device of claim 16, wherein the signal transmission lines vertically connect different substrates of the first or second multilayered PCB by signal vias, wherein the windows are formed in a middle substrate disposed between the vertically connected substrates at positions corresponding to the signal vias to be larger than via pads including the signal vias, and wherein electrical characteristics by the vertically connected signal vias are improved by the windows.

18. The connector device of claim 16, wherein the signal transmission line comprises:

signal pads on which signal vias for the vertical connection for the signal transmission are disposed; and a signal line connected to the signal pads, having a width narrower than a diameter of the signal pads, and extending by a predetermined length.

19. The connector device of claim 13, wherein a transceiver circuit is disposed on the first multilayered PCB, and antennas are disposed on the second multilayered PCB, and wherein the first and second multilayered PCBs comprise ground patterns constituting a ground vertical-connection between different layers.

20. The connector device of claim 19, wherein the ground patterns each comprises:

ground pads on which ground vias for the ground vertical-connection are disposed; and ground lines connecting the ground pads, and wherein the ground patterns are formed on the same position of different layers of the first and second multilayered PCBs.

21. The connector device of claim 20, wherein the ground pattern is provided in plurality to correspond to a plurality of ground terminals of the connector, wherein the signal transmission line is disposed between the plurality of ground patterns, and wherein a length of a signal line of the signal transmission line is the same as a length of a ground pad of the ground pattern.

22. The connector device of claim 21, wherein the ground pad includes first and second circular ground pads each having the same circular shape as that of the ground via, and wherein each of the first and second circular ground pads is connected to the ground line having a width narrower than a diameter of the ground pad.

* * * * *